United States Patent
Takeshita et al.

(10) Patent No.: US 6,573,488 B1
(45) Date of Patent: Jun. 3, 2003

(54) SEMICONDUCTOR POSITION SENSITIVE DETECTOR

(75) Inventors: Tatsuo Takeshita, Hamamatsu (JP); Masayuki Sakakibara, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 343 days.

(21) Appl. No.: 09/694,312

(22) Filed: Oct. 24, 2000

Related U.S. Application Data

(63) Continuation-in-part of application No. PCT/JP98/04614, filed on Oct. 13, 1998.

(51) Int. Cl.$^7$ .............................. H01L 31/16; G01C 3/06
(52) U.S. Cl. .............................. 250/214.1; 250/214 PR; 257/448
(58) Field of Search .................... 250/214.1, 214 R, 250/214 PR; 257/443, 448, 459

(56) References Cited

U.S. PATENT DOCUMENTS

| | | | | |
|---|---|---|---|---|
| 2,896,086 A | * | 7/1959 | Wunderman | 250/214 PR |
| 3,414,730 A | * | 12/1968 | Nicolas | 250/214 PR |
| 5,703,357 A | * | 12/1997 | Shih et al. | 250/214 PR |

FOREIGN PATENT DOCUMENTS

| | | |
|---|---|---|
| DE | 2 221 657 | 5/1972 |
| JP | 1-115169 | 5/1989 |
| JP | 1-115170 | 5/1989 |
| JP | 4-111480 | 4/1992 |
| JP | 4-240511 | 8/1992 |
| JP | 4-313279 | 11/1992 |
| JP | 5-5619 | 1/1993 |
| JP | 5-13808 | 1/1993 |
| JP | 5-005619 | 1/1993 |
| JP | 5-118848 | 5/1993 |
| JP | 6-112520 | 4/1994 |
| JP | 6-140665 | 5/1994 |

\* cited by examiner

*Primary Examiner*—Stephone B Allen

(57) ABSTRACT

A plurality of resistive regions constituting a resistive region gradually increase in width from one end to the other end and have substantially the same resistivity. If, therefore, this semiconductor position sensitive detector is placed such that charges generated in accordance with incident light from an object at a long distance flow into narrow resistive regions, since the narrow resistive regions have high resistances, the output currents from the two ends of the resistive region greatly change to improve the position detection precision even in a case wherein the incident light position only slightly moves on the surface as the distance to the object changes.

6 Claims, 39 Drawing Sheets

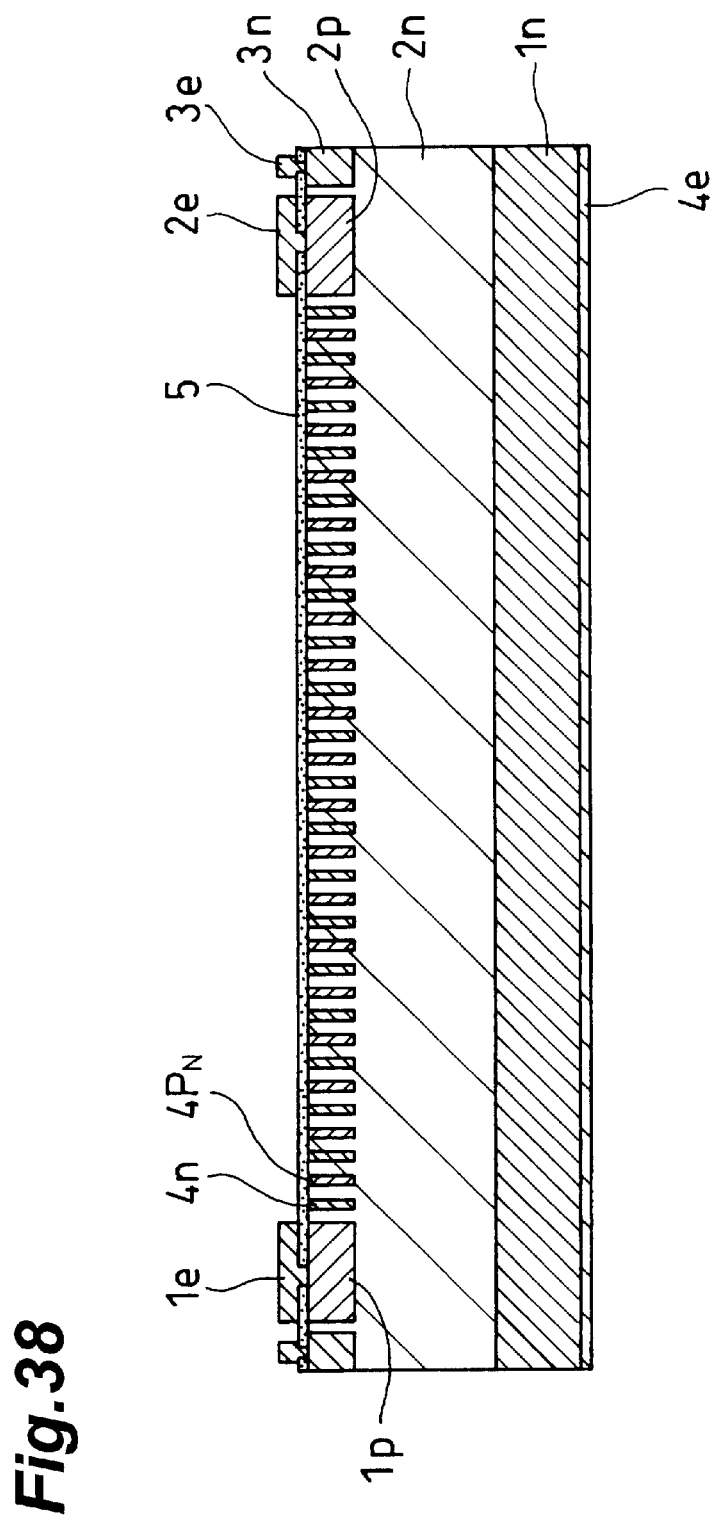

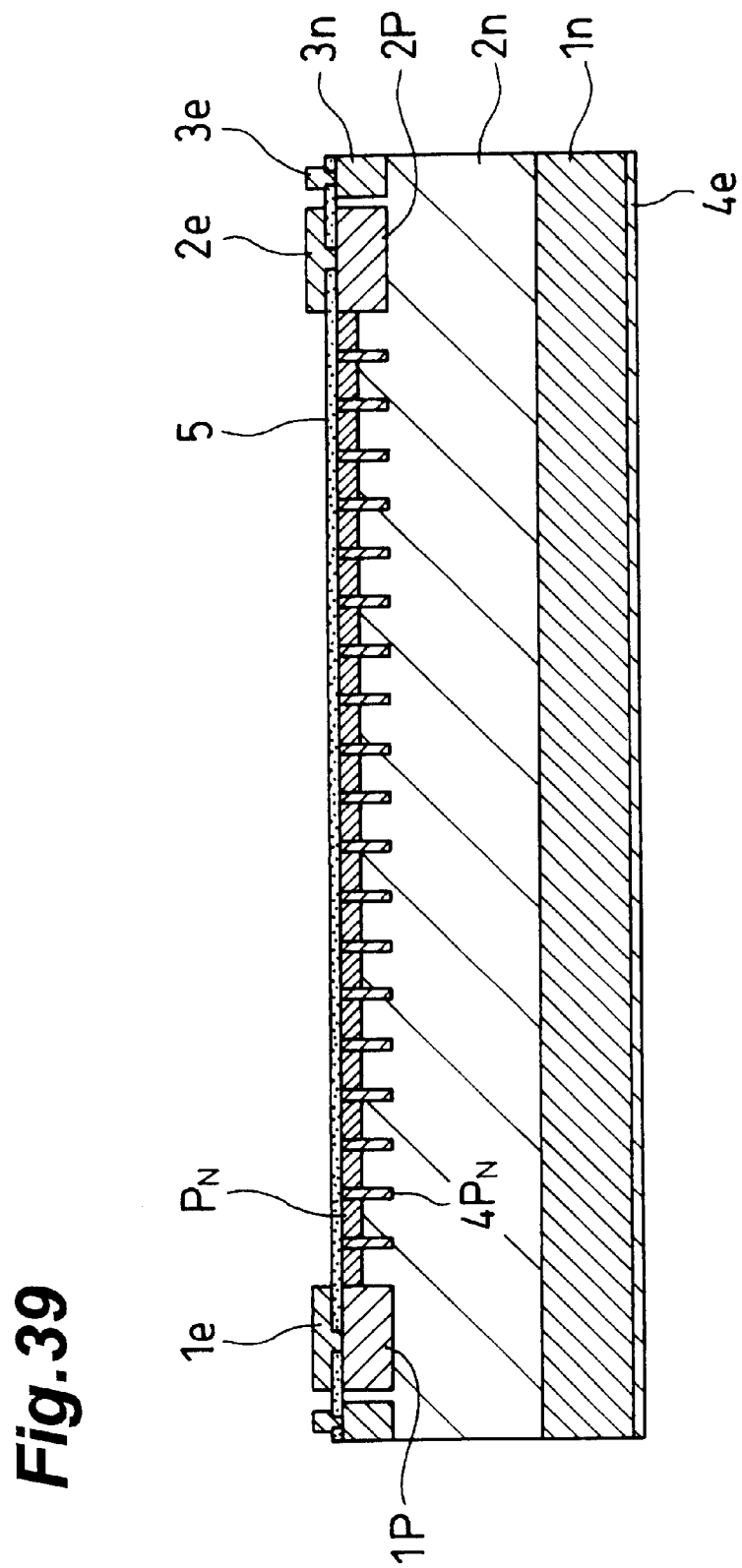

SEMICONDUCTOR POSITION SENSITIVE DETECTOR

RELATED APPLICATION

This is a continuation-in-part application of application Ser. No. PCT/JP98/04614 filed on Oct. 13, 1998, now pending.

BACKGROUND OF THE INVENTION

1. Field of the Invention

The present invention relates to a semiconductor position sensitive detector (PSD) for detecting the position of incident light.

2. Related Background Art

A semiconductor position sensitive detector (PSD) is known as a device for measuring the distance to an object (to be measured) by using the so-called triangulation principle. The PSD is mounted as an active distance measuring device in an image sensor such as a camera. In such an image sensor, the photographing lens is focused on the basis of the distance to the object which is measured by the PSD.

SUMMARY OF THE INVENTION

In the above PSD, the position of an incident light spot on the surface of the PSD moves in accordance with the distance to the object. The resistance value of the resistive layer of the PSD is divided in accordance with the incident light spot position, and an output current from the PSD changes in accordance with the resistance division ratio. The distance to the object can therefore be obtained on the basis of the output current. In distance measurement using the triangulation principle, when the distance to an object at a short distance changes, the position of an incident light spot greatly moves on the surface. In contrast to this, when the distance to an object at a long distance changes, the position of an incident light spot does not move much. That is, conventionally, the distance detection precision for an object at a long distance is lower than that for an object at a short distance. Under the circumstances, a PSD is disclosed in Japanese Patent Laid-Open No. 4-240511, in which the width of a resistive layer to be irradiated with an incident light is decreased linearly from the short distance side to the long distance side of the surface, so that the resistance division ratio of the resistive layer greatly changes even if the movement amount of an incident light spot from an object at a long distance is small.

In the PSD disclosed in the reference described above, the width of the resistive layer is increased linearly from the long distance side to the short distance side, i.e., the width of the resistive layer is decreased linearly from the short distance side to the long distance side. The resistive layer can be regarded as a set of minute resistors connected in the form of a matrix. Charges that are generated when light is incident on the resistive layer are divided on the basis of the resistance ratios between the incident light position and the electrodes on the two ends of the resistive layer. When only some of the group of minute resistors arrayed in the widthwise direction of the resistive layer are irradiated with incident light in the form of a spot, generated charges do not uniformly pass through the resistive layer along the lengthwise direction. Therefore, an expression representing the relationship between an incident light position and an output current, logically calculated from the shape of the resistive layer, varies depending on the incident light position and incident light shape. This makes it difficult to accurately compute an incident light position from an output current by using the single expression. That is, a plurality of different arithmetic circuits are required for different incident light positions and incident light shapes to obtain accurate incident light positions from output currents. In other words, in the above conventional PSD, only when the whole group of minute resistors arrayed in the widthwise direction of the resistive layer is irradiated with incident light, i.e., only when incident light in the form of a slit strikes across the resistive layer, an incident light position can be obtained by using a single arithmetic circuit.

The present invention has been made to solve the above problems, and has as its object to provide a semiconductor position sensitive detector which can further improve position detection precision as compared with the prior art, and is free from any limitations on incident light shapes.

A semiconductor position sensitive detector according to the present invention is characterized by comprising a resistive region lined up in a predetermined direction, and a plurality of conductive strips running from the resistive region such that different output currents are obtained from two ends of the resistive region in accordance with incident light positions on the surface, wherein the resistive regions have substantially the same resistivity, and gradually increase in width in a direction perpendicular to the predetermined direction from one end to the other end of the resistive region. Although the plurality of resistive regions are preferably continuous, respectively, with conductive strips being interposed therebetween, the resistive regions may be continuous, respectively, in contact with each other.

The position of incident light moves on the surface in accordance with the distance to the object. Charges generated in accordance with irradiation of the incident light flow into the resistive region through the conductive strips. Since the conductive strips run such that different output currents are obtained from the two ends of the resistive region in accordance with the incident light position on the surface, the incident light position can be obtained from these output currents.

A plurality of resistive regions gradually increase in width from one end to the other end and are substantially equal in resistivity. Since the narrow resistive regions have high resistances, output currents from the two ends of the resistive region greatly change even in a case wherein the incident light position only slightly moves on the surface with a change in the distance to the object.

Note that since light beam is incident in the part of the conductive strips, and generated charges are resistance-divided in the resistive region, the width of the resistive region can be reduced, and a desired resistance can be obtained even if the impurity concentration is increased to decrease the resistivity. That is, since the ratio of the minimum controllable impurity concentration to the total impurity concentration decreases with an increase in impurity concentration, variations in resistivity reduce, and the position detection precision improves.

In addition, the width of each resistive region is preferably a liner or quadratic function of a position from one end of the resistive region along a predetermined direction. Since the surface formed on each branch conductive layer is irradiated with incident light, the distance to the object can be computed from output currents from the two ends of the resistive region by using a function for distance detection which is derived from the fact that the width of each resistive region is a linear or quadratic function of a position regardless of the shape of incident light.

Assume that signal extraction electrodes for extraction of output currents are formed on the two ends of the resistive region. In this case, if the conductive strips adjacent to these electrodes are irradiated with incident light beams, since the signal extraction electrodes are irradiated with part of the incident light beams, the barycentric position of each incident light beam deviates from the true position toward the branch conductive layer side, resulting in a decrease in position detection precision.

The semiconductor position sensitive detector of the present invention is characterized by further comprising a semiconductor region which is adjacent to a predetermined one of the conductive strips, which runs from one end portion of the resistive region and having a smallest width, and has a resistivity lower than that of the resistive region, and a signal extraction electrode which is formed at a position into which a charge passing through the semiconductor region can flow without the mediacy of the resistive region in accordance with the incident light, and from which one of the output currents is extracted.

In the absence of the semiconductor region, if the branch conductive layer and signal extraction electrode which run from the narrowest resistive region are irradiated with incident light, an output current from the signal extraction electrode is reduced because the incident light is blocked by the signal extraction electrode. The semiconductor position sensitive detector of the present invention, however, comprises a semiconductor region, and hence charges generated in accordance with incident light entering the semiconductor layer flow into the signal extraction electrode without the mediacy of the resistive region to increase an output current from the signal extraction electrode. This makes it possible to bring the computed barycentric position of the incident close to the true position and improve the position detection precision.

When the resistive region is irradiated with light, the computed incident light position may deviate from the true value depending on the shape of the light. When, therefore, a higher precision is required, this semiconductor position sensitive detector comprises a light-shielding film formed on the resistive region, thereby further improving the position detection precision.

Furthermore, this semiconductor position sensitive detector is characterized in that the detector comprises a pair of signal extraction electrodes from which output currents from the two ends of the resistive region are respectively extracted, and if the resistive region is located between the signal extraction electrodes, the light-shielding film is made of an insulating material and covers the resistive region between the signal extraction electrodes. When the light-shielding film is made of an insulating film, even if the entire region of the resistive region between the signal electrodes is covered with the light-shielding film, the signal extraction electrodes are not short-circuited.

In addition, this light-shielding film is preferably made of a black photoresist. A light-shielding film can therefore be formed by developing and curing.

BRIEF DESCRIPTION OF THE DRAWING

FIG. 38 is a sectional view taken along an arrow I—I of the PSD in FIG. 37; and

FIG. 39 is a sectional view taken along an arrow II—II of the PSD in FIG. 37.

DESCRIPTION OF THE PREFERRED EMBODIMENT

Figure 1:
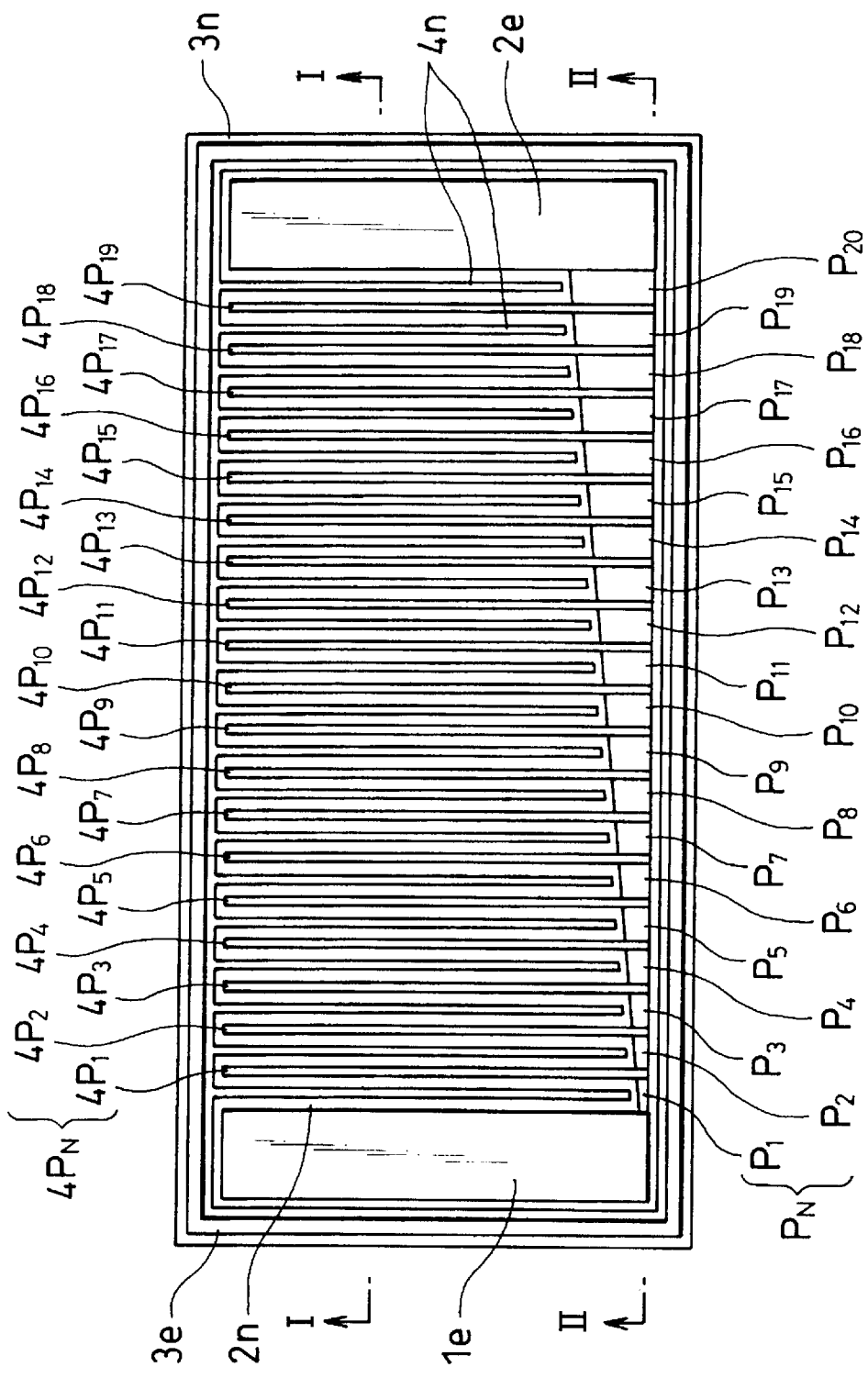
FIG. 1 is a top view of a PSD according to the first embodiment.

Semiconductor position sensitive detectors according to embodiments will be described below. The same reference numerals denote the same parts or parts having the same functions, and a repetitive description thereof will be avoided.

(First Embodiment)

FIG. 1 is a top view of a semiconductor position sensitive detector (PSD) according to the first embodiment.

Figure 2:
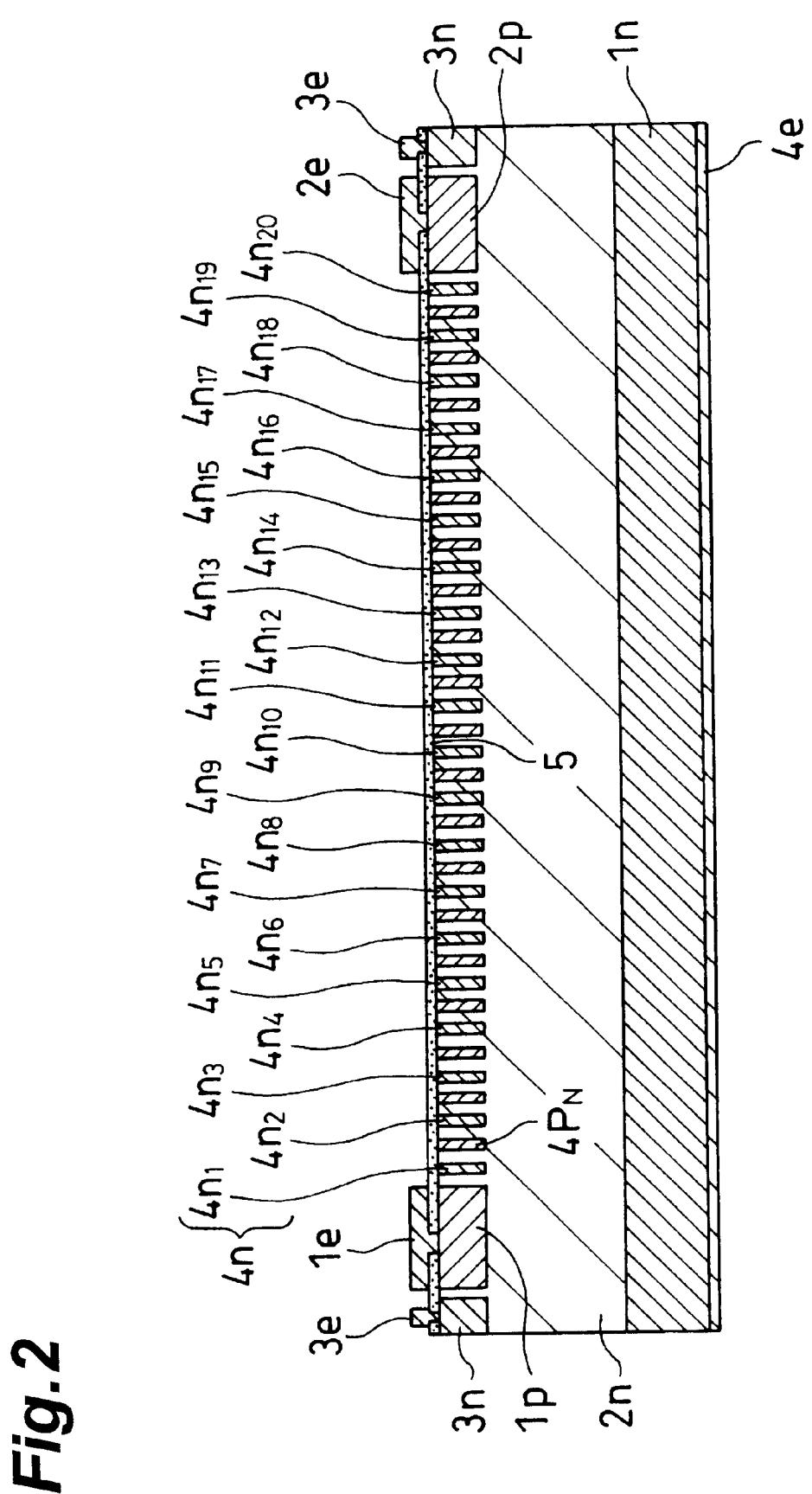
FIG. 2 is a sectional view taken along an arrow I—I of the PSD in FIG. 1.
Figure 3:
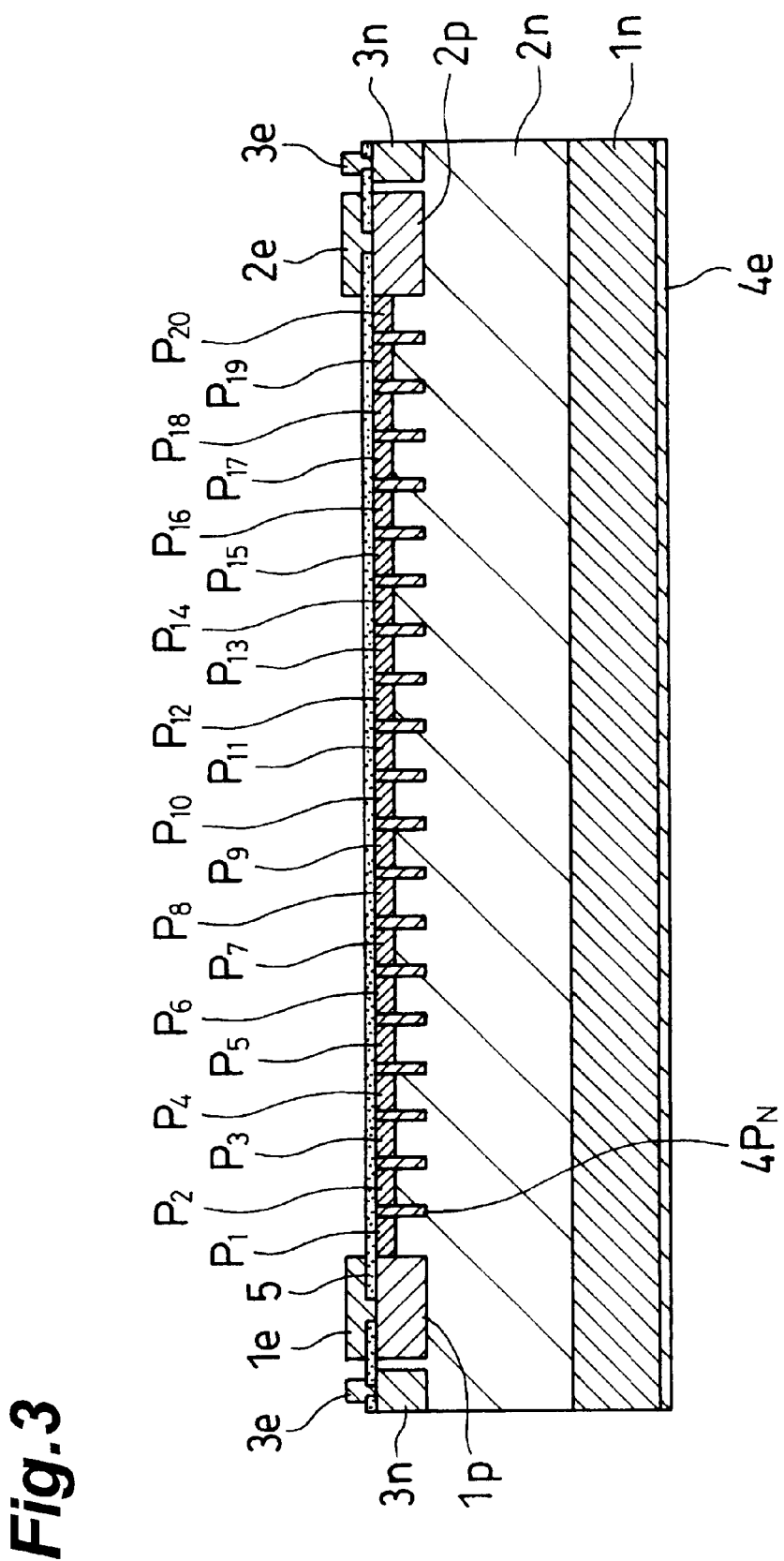
FIG. 3 is a sectional view taken along an arrow II—II of the PSD in FIG. 1.

FIG. 2 is a sectional view taken along an arrow I—I of the PSD in FIG. 1. FIG. 3 is a sectional view taken along an arrow II—II of the PSD in FIG. 1.

The PSD according to this embodiment comprises a semiconductor substrate $2n$ made of lightly doped n-type Si and a lower-surface-side n-type semiconductor layer $1n$ made of a n-type Si and formed on the lower surface of the semiconductor substrate $2n$. The semiconductor substrate $2n$ has a rectangular surface. In the following description, the direction from the lower-surface-side n-type semiconductor layer $1n$ to the n-type semiconductor substrate $2n$ is defined as an upward direction; the direction in which a long side of the rectangular surface of the n-type semiconductor substrate $2n$ extends, a lengthwise direction (longitudinal direction) X; the direction in which a short side extends, a widthwise direction Y; and a direction perpendicular to both the lengthwise direction X and the widthwise direction Y, a depth direction (thickness direction) Z. That is, the directions X, Y, and Z are perpendicular to each other.

This PSD comprises a main resistive region $P_N$ formed in the semiconductor substrate $2n$ and running along the lengthwise direction X. The resistive region $P_N$ is made of p-type Si and lower in resistivity than the semiconductor substrate $2n$. The resistive region $P_N$ has a plurality of p-type resistive regions $P_1$ to $P_{20}$ continuously lined up along the lengthwise direction X and formed in the n-type semiconductor substrate $2n$. The resistive regions $P_1$ to $P_{20}$ have substantially the same impurity concentration and run from the upper surface of the n-type semiconductor substrate $2n$ to substantially the same depth along the depth direction Z. The resistive regions $P_1$ to $P_{20}$ have substantially the same resistivity $\rho$. Each of the resistive regions $P_1$ to $P_{20}$ has a trapezoidal surface. Both the upper and lower bases of the trapezoidal surface of each resistive region are parallel to the widthwise direction Y. Of the two remaining sides, one side located on the outer edge side of the PSD surface is parallel to the lengthwise direction X and perpendicular to the upper and lower bases. The other side of each trapezoidal surface forms the same angle with respect to the lengthwise direction X. In addition, these two sides are located on the same straight line. The contour of the surface of the resistive region PN forms a substantially trapezoidal shape as a whole.

This PSD comprises a pair of signal extraction electrodes $1e$ and $2e$ which are formed on two end portions of the upper surface of the PSD to extract output currents from the two ends of the resistive region $P_N$. In the following description, that position of the resistive region $P_N$ which is nearest to the signal extraction electrode $1e$ is assumed to be a reference position (X=0) in the lengthwise direction X. Likewise, the position of that side of the upper surface of the resistive region $P_N$ which is parallel to the lengthwise direction X is assumed to be a reference position (Y=0) in the widthwise direction Y.

In addition, a direction from the signal extraction electrode $1e$ to the signal extraction electrode $2e$ is assumed to a positive X direction, and a direction from the edge of the substrate $2n$ closest to the resistive region $P_N$ and toward the edge of the substrate $2n$ farthest from the resistive region $P_N$ is assumed to a positive Y direction.

According to the PSD of this embodiment, a width Y of the resistive region $P_N$ gradually increases from the signal extraction electrode $1e$ to the signal extraction electrode $2e$. The PSD has a relationship defined by width $Y=aX+b$, where a and b are constants.

This PSD comprises a plurality of conductive strips $4P_N$ running from the resistive region $P_N$. Each branch conductive layer $4P_N$ is made of p-type Si. The impurity concentration of the branch conductive layer $4P_N$ is higher than that of the resistive region $P_N$. The resistivity of the branch conductive layer $4P_N$ is lower than that of the resistive region $P_N$. A plurality of conductive strips $4P_1$ to $4P_{19}$ are formed in the n-type semiconductor substrate $2n$ and run from between the plurality of resistive regions P1 to $P_{20}$ along the widthwise direction Y. The conductive strips $4P_1$ to $4P_{19}$ run from the upper surface of the n-type semiconductor substrate $2n$ along the thickness direction Z to a position deeper than the resistive region $P_N$, and have the same length in the widthwise direction Y.

The length of each branch conductive layer $4P_N$ along the widthwise direction Y is larger than the diameter of an incident light spot. This makes it possible to prevent this spot from entering the resistive region $P_N$.

This PSD comprises a pair of signal extraction semiconductor layers $1p$ and $2p$ which are continuous with the two ends of the resistive region $P_N$, which is constituted by the resistive regions $P_1$ to $P_{20}$ continuously lined up in the lengthwise direction X, and are formed in the semiconductor substrate $2n$. The signal extraction semiconductor layers $1p$ and $2_p$ are made of p-type Si. The signal extraction semiconductor layers $1p$ and $2p$ run from the upper surface of the semiconductor substrate $2n$ along the thickness direction Z to a position deeper than the resistive regions $P_1$ to $P_{20}$. Each of the signal extraction semiconductor layers $1p$ and $2p$ has a rectangular surface. The long sides of the rectangular surface of each layer are parallel to the widthwise direction Y, and their short sides are parallel to the lengthwise direction X. The two ends of the resistive region $P_N$ are respectively continuous with the signal extraction semiconductor layers $1p$ and $2p$ with one end portion of a long side of the rectangular surface of each of the signal extraction semiconductor layers $1p$ and $2p$ serving as a boundary. In other words, one end portion of the resistive region $P_N$ along the lengthwise direction X, i.e., the resistive region $P_1$ having the smallest width Y, is continuous with one end portion of one signal extraction semiconductor layer $1p$ along the widthwise direction Y. The other end portion of the resistive region $P_N$ along the lengthwise direction X, i.e., the resistive region $P_{20}$, having the largest width Y, is continuous with one end portion of the other signal extraction semiconductor layer $2p$ along the widthwise direction Y.

This PSD comprises an outer frame semiconductor layer $3n$ formed on the outer peripheral portion of the rectangular surface of the semiconductor substrate $2n$. The outer frame semiconductor layer $3n$ is made of n-type Si. The outer frame semiconductor layer $3n$ is formed in the outer edge region of the rectangular surface of the semiconductor substrate $2n$ to have a rectangular shape, surrounds the substrate surface region in which the conductive strips $4P_N$, resistive region $P_N$, and signal extraction semiconductor layers $1p$ and $2p$ are formed, and runs from the upper surface of the n-type semiconductor substrate $2n$ to a predetermined depth along the thickness direction Z.

This PSD comprises a branch conductive layer isolation semiconductor layer $4n$ formed in the semiconductor substrate $2n$. The branch conductive layer isolation semiconductor layer $4n$ is made of n-type Si. The branch conductive layer isolation semiconductor layer $4n$ is constituted by a plurality of n-type branch regions $4n_1$ to $4n_{20}$ running from the inside of one long side of the rectangular outer frame semiconductor layer $3n$ toward the resistive region $P_N$ along the widthwise direction Y. Each of the branch regions $4n_1$ to $4n_{20}$ runs from the upper surface of the n-type semiconductor substrate $2n$ to a predetermined depth. The n-type branch regions $4n_2$ to $4n_{19}$ have substantially the same depth as that of the p-type conductive strips $4P_1$ to $4P_{19}$ and are interposed between the conductive strips $4P_1$ to $4P_{19}$ to electrically isolate the conductive strips $4P_1$ to $4P_{19}$. That is, the branch regions $4n_2$ to $4n_{19}$ prevent currents from flowing between the adjacent conductive strips $4P_1$ to $4P_1$ along the lengthwise direction X. The outermost branch regions $4n_1$ and $4n_{20}$ are respectively interposed between the conductive strips $4P_1$ and $4P_{19}$ and the signal extraction semiconductor layers $1p$ and $2p$, which are located at the outermost positions, to electrically isolate the conductive strips $4P_1$ and $4P_{19}$ from the signal extraction semiconductor layers $1p$ and $2p$.

This PSD comprises a passivation film 5 covering the rectangular surface of the n-type semiconductor substrate $2n$. Note that an illustration of the passivation film 5 is omitted from FIG. 1 and the top views of the PSDs according to the following embodiments. The passivation film 5 has a pair of rectangular openings for signal extraction electrodes in two end portions in the lengthwise direction, and a rectangular opening for an outer frame electrode in an outer peripheral portion. The passivation film 5 is made of $SiO_2$. The signal extraction electrodes $1e$ and $2e$ are respectively formed on the signal extraction semiconductor layers $1p$ and $2p$ through the pair of openings of the passivation film 5 which are used for signal extraction electrodes, and are in ohmic-contact with the signal extraction semiconductor layers $1p$ and $2p$. The surface shape of the signal extraction electrodes $1e$ and $2e$ are identical to that of the signal extraction semiconductor layers $1p$ and $2p$.

This PSD comprises an outer frame electrode $3e$ formed on the n-type outer frame semiconductor layer $3n$ through the outer frame electrode opening of the passivation film 5. The outer frame electrode $3e$ is in ohmic-contact with the outer frame semiconductor layer $3n$. The outer frame electrode $3e$ prevents light incident from the outer peripheral portion of the semiconductor substrate $2n$. A predetermined voltage may be applied between the outer frame electrode $3e$ and the signal extraction electrodes $1e$ and $2e$.

This PSD comprises an electrode $4e$ formed on the surface of n-type semiconductor layer $1n$. The electrode $4e$ is the ohmic-contact with the n-type semiconductor layer $1n$.

When light beam is incident on the surface region of the n-type semiconductor substrate $2n$ on which the conductive strips $4P_N$ are formed while a voltage is applied between the signal extraction electrodes $1e$ and $2e$ and the lower-surface electrode $4e$ so as to supply a reverse bias voltage to pn junction diodes formed by the conductive strips $4P_N$ and n-type semiconductor substrate $2n$, hole-electron pairs (charges) are generated inside the PSD in accordance with the incident light, and some of them flow into the conductive strips $4P_N$ in accordance with diffusion and the electric field in the PSD. These charges flow into predetermined resistive regions of the resistive region $P_N$ through the conductive strips $4P_N$ and the charge amounts are distributed in accordance with the positions of the predetermined resistive regions in the lengthwise direction X of the resistive region $P_N$. The distributed charges are extracted from the signal extraction electrodes $1e$ and $2e$ through the two ends of the resistive region $P_N$.

The PSD according to this embodiment comprises the above conductive strips $4P_N$, and the surface formed on the conductive strips $4P_N$ are irradiated with incident light. Position can therefore be accurately obtained regardless of the shape of incident light, and the position detection precision can be improved as compared with the conventional PSD.

Let I1 and I2 be the output currents respectively output from the signal extraction electrodes $1e$ and $2e$ in accordance with incidence of light beam the on the surface in the following description.

Figure 4:
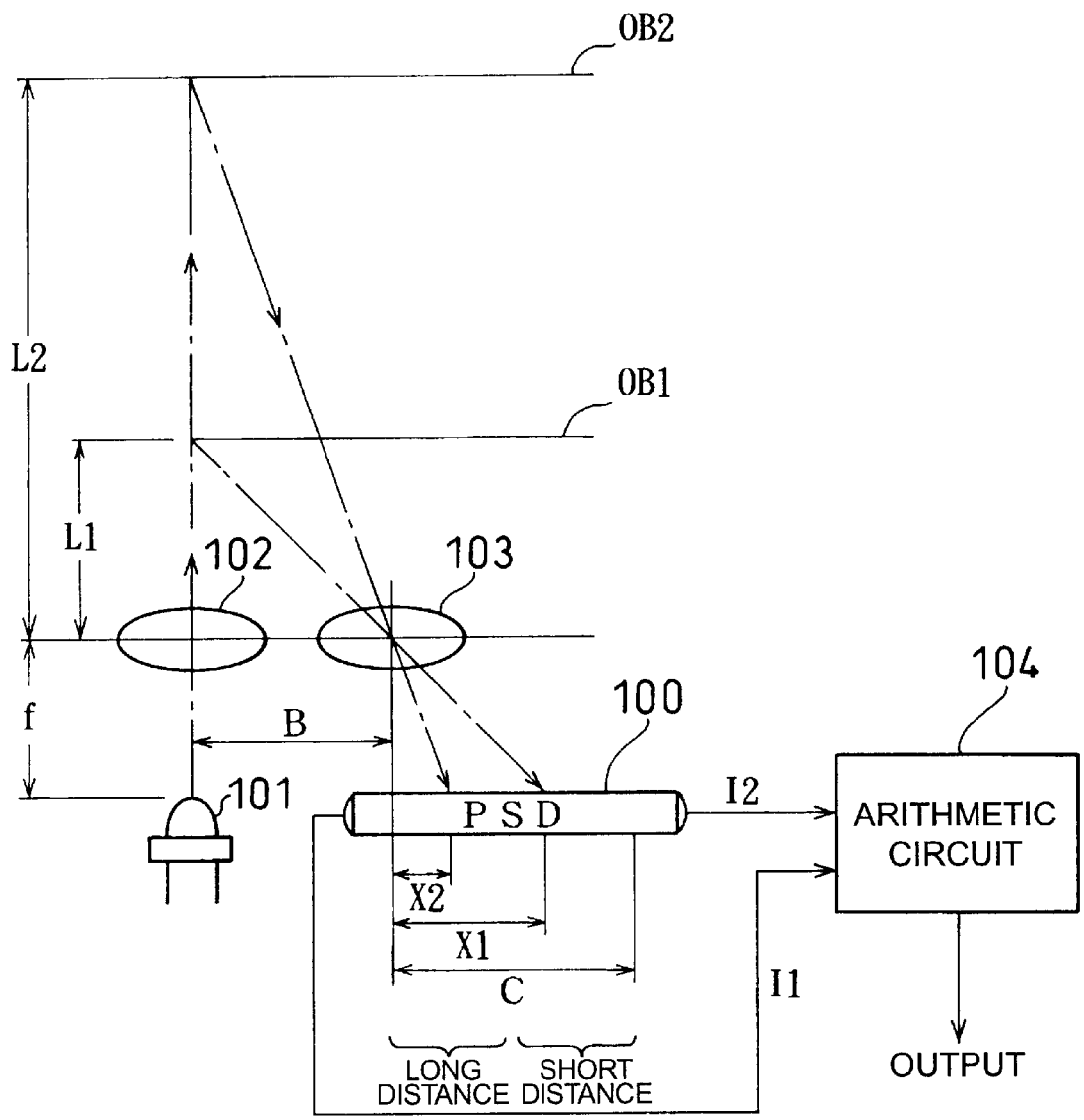
FIG. 4 is a view showing the arrangement of a distance measuring device using the PSD.

FIG. 4 shows a distance measuring device using a PSD 100 in FIG. 1. This distance measuring device can be installed in an image sensor such as a camera. As this distance measuring device, any one of the PSDs of the following embodiments can be used in placed of the PSD shown in FIG. 1. This distance measuring device comprises the PSD 100, a light-emitting diode (LED) 101, a projection lens 102, a focusing lens 103, and an arithmetic unit 104. The above voltage is applied to the PSD 100. The PSD 100 is positioned such that the lengthwise direction X becomes parallel to a line segment defined by the distance between the optical axes between the lenses 102 and 103 (baseline length) B, and the signal extraction electrode $1e$ is located closer to the optical axis of the lens 103 than the signal extraction electrode $2e$. A distance f between the lenses 102 and 103 and the surface of the PSD 100 is almost equal to the focal length of the lenses 102 and 103. Note that a surface portion coinciding with the end portion of the resistive region $P_N$ which is nearest to the signal extraction electrode $1e$ is located on the optical axis of the focusing lens 103.

When a given object OB1 to be measured that is located at a short distance (L1) is irradiated with infrared light emitted by the LED 101 through the projection lens 102, light reflected by the object OB1 is incident on the short distance side of the surface of the semiconductor position sensitive detector, i.e., the branch conductive layer $4P_N$ near the signal extraction electrode $2e$, through the focusing lens 103. Light reflected by an object OB2 is incident on the long distance side of the surface of the PSD, i.e., the branch conductive layer $4P_N$ near the signal extraction electrode $1e$, through the focusing lens 103.

An incident position X1 at which the light reflected by the object OB1 at the short distance is incident on the surface is spaced apart from the optical axis of the focusing lens 103 by a distance X1 along the lengthwise direction X of the PSD. An incident position X2 at which the light reflected by the object OB2 at the long distance is incident on the surface is spaced apart from the optical axis of the focusing lens 103 by a distance X2 along the lengthwise direction X of the PSD. The total length of the resistive region $P_N$ in the lengthwise direction X is represented by C.

A distance L (L1, L2) to an object and an incident light spot position X (X1, X2) have a relationship (FIG. 5) given by $$L = f \times (B/X) \qquad (1)$$

Note that in the PSD of this embodiment, baseline length B=30 mm and focal length f=15 mm.

Figure 5:
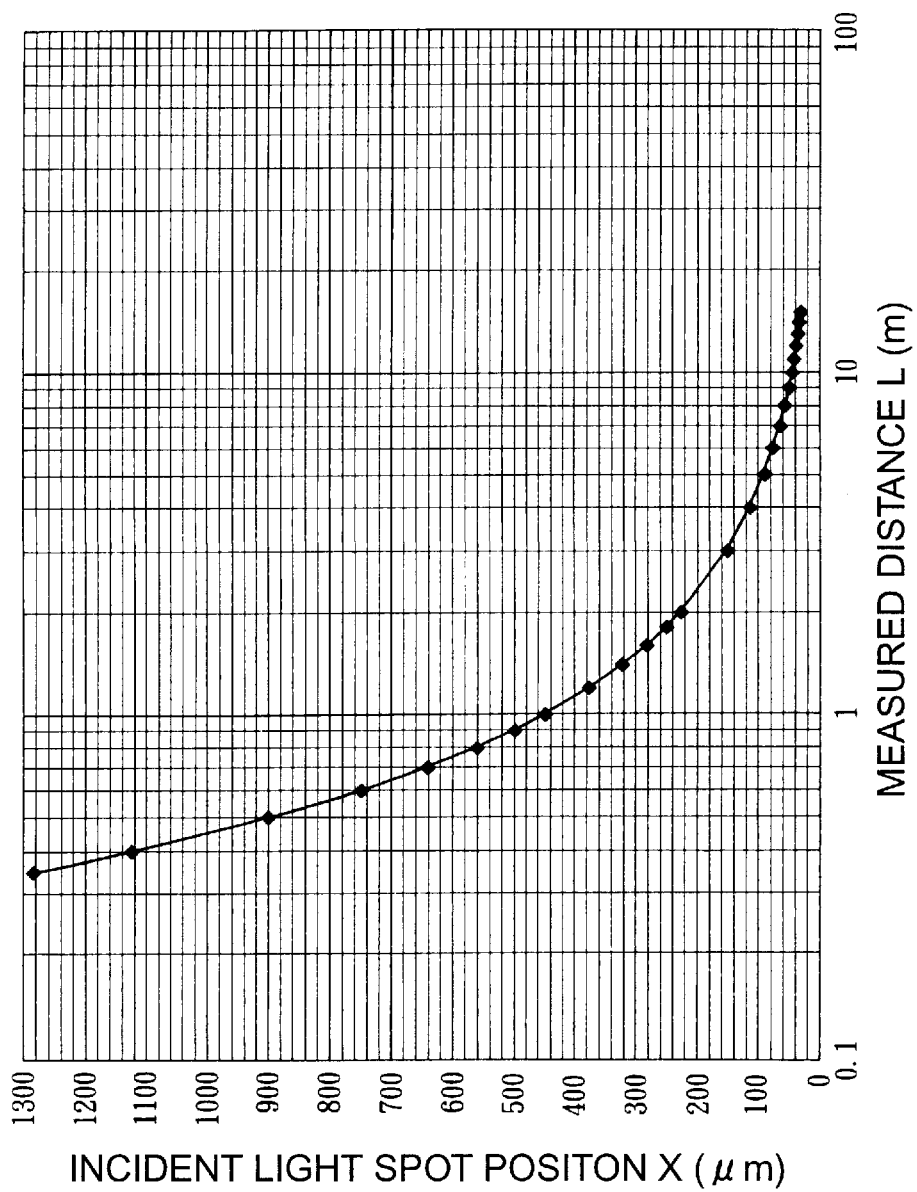
FIG. 5 is a graph showing the relationship between a measured distance L (m) and an incident light position X ($\mu$m) of the first embodiment.
Figure 6:
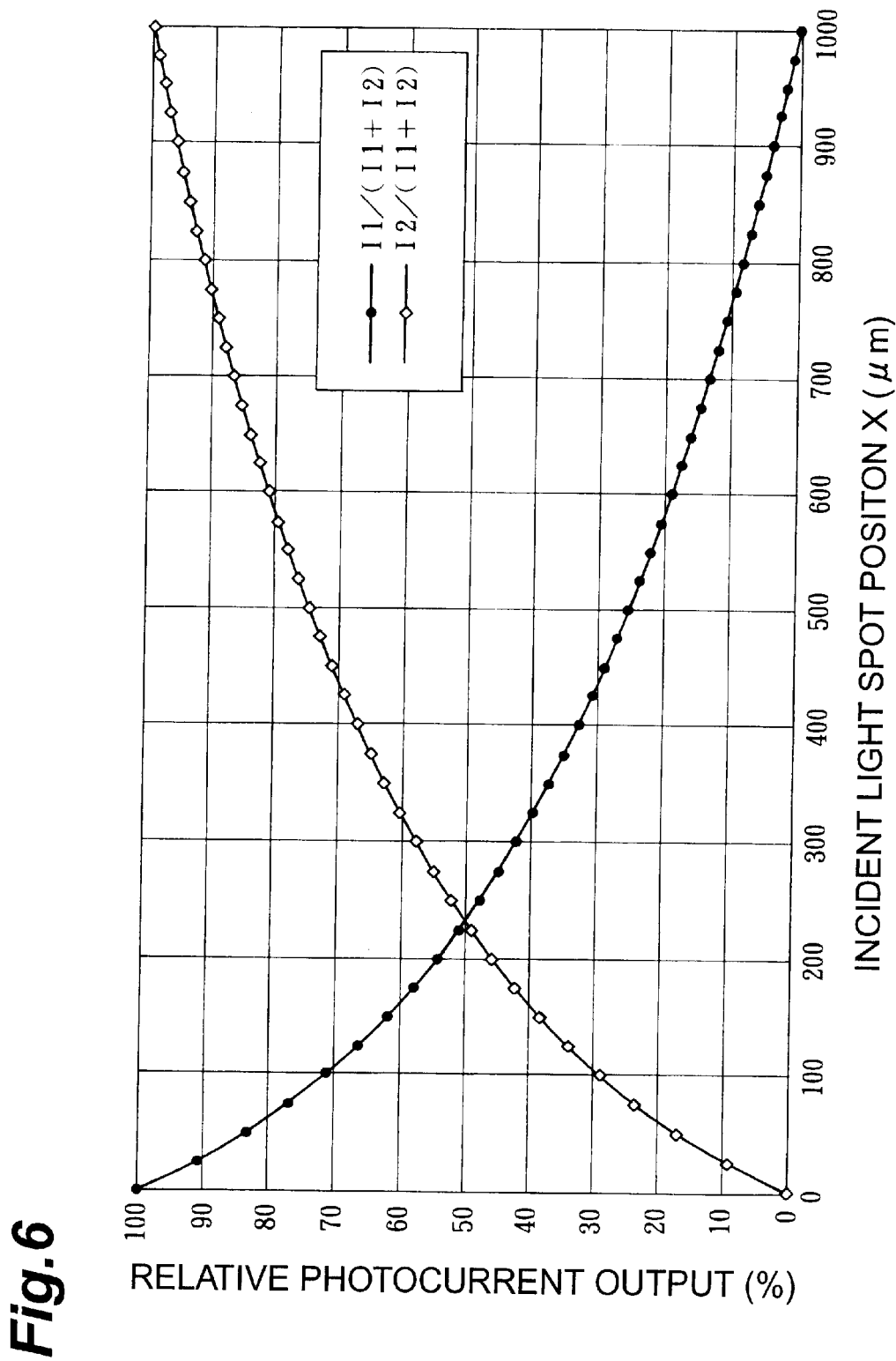
FIG. 6 is a graph showing the relationship between the incident light spot position X ($\mu$m) and the relative photo-current output (%)

As shown in FIG. 5, as the distance L increases, the movement amount of the incident light spot position X with respect to the variation amount of the distance L decreases. A width Y of the resistive region $P_N$ and a lengthwise position X have a relationship of Y=aX+b. That is, the width Y of the resistive regions $P_1$ to $P_{20}$ is a linear function of the position X along the lengthwise direction from one end of the resistive region $P_N$. In this case, the incident light position X and the relative photocurrent output (%) have the relationship shown in FIG. 6. Assume that the total length C of the resistive region $P_N$ is 1,000 μm, and the width Y and position X satisfy Y=0.1X+10(μm). Note that the relative photocurrent output is the ratio of the output currents I1 and I2 from the two ends of the resistive region $P_N$ to the total output current I1+I2. If ratio R1=I1/(I1+I2) and ratio R2=I2/(I1+I2) are calculated, the incident light spot position X is given by $$X = 10^{(\log|b/a| \times R1 + \log|c+b/a| \times R2)} - (b/a) \qquad (2)$$

Upon computing the ratios R1 and R2 from the output currents I1 and I2, the arithmetic unit 104 computes the position X and searches for a distance L corresponding to the position X in a memory storing a table indicating the relationship between the distance L and position X calculated in advance, thereby obtaining the distance L. Note that since the incident light position X has the following relationship, the distance L may be calculated by the equation given above after the position X is directly computed from the equation given below:

$$X = 10^{(\log|b/a| \times I1 + \log|c+b/a| \times I2)/(I1+I2)} - (b/a) \qquad (3)$$

(Second Embodiment)

Figure 7:
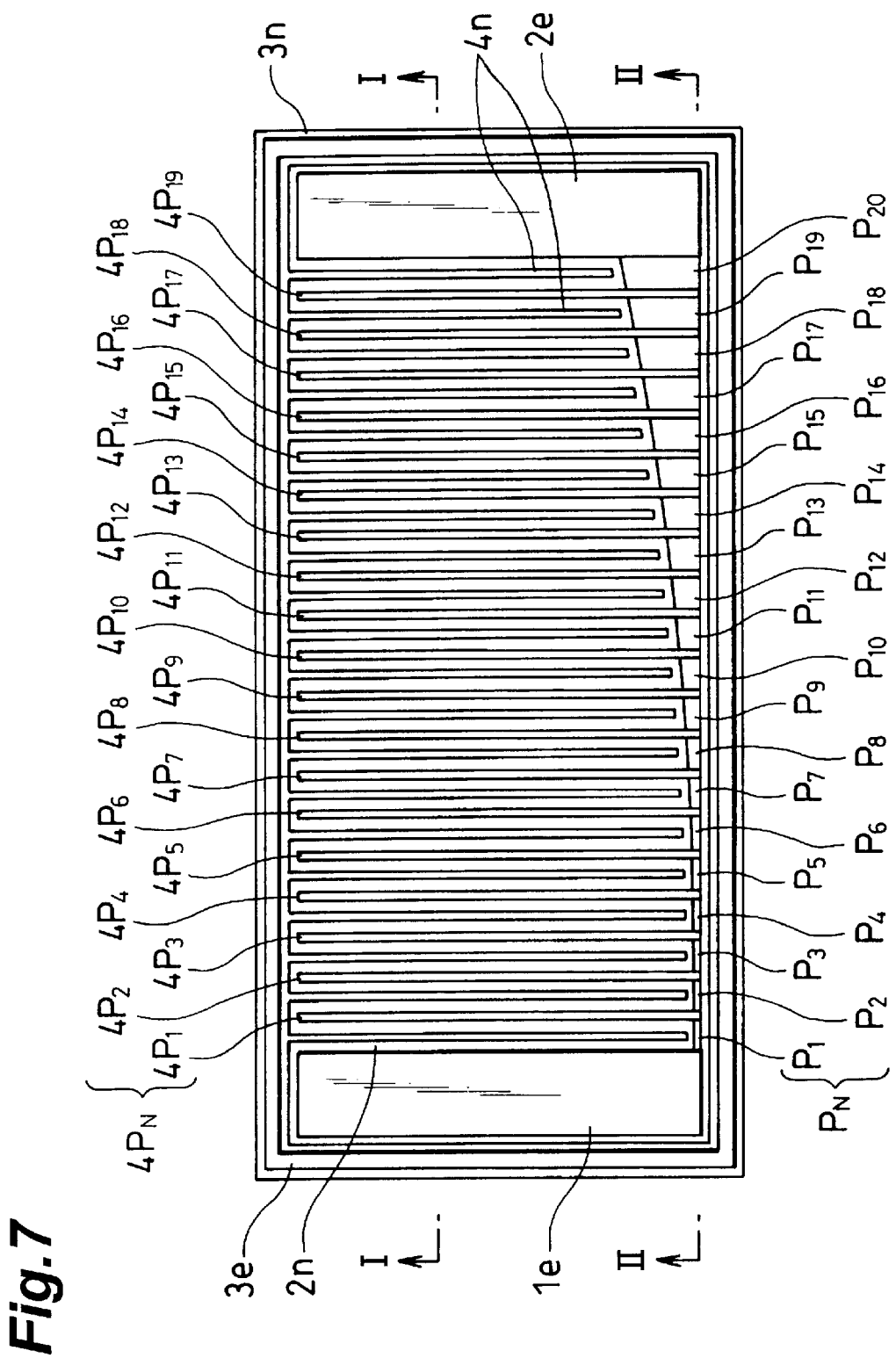
FIG. 7 is a top view of a PSD according to the second embodiment.
Figure 8:
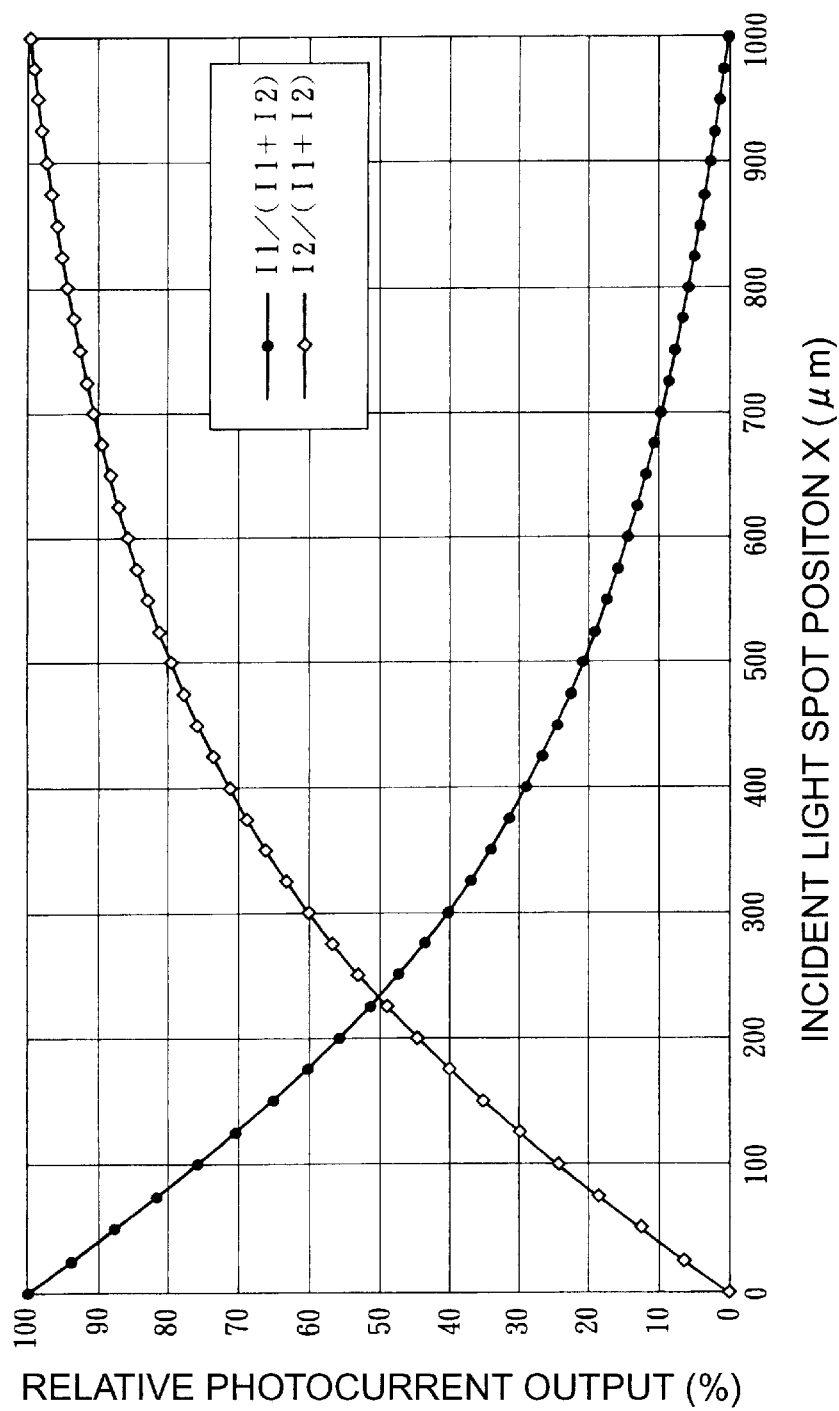
FIG. 8 is a graph showing the relationship between the incident light spot position X ($\mu$m) and the relative photo-current output (%) of the second embodiment.

FIG. 7 is a top view of a PSD according to the second embodiment. Since sectional views taken along arrows I—I and II—II of the PSD in FIG. 7 are the same as FIGS. 2 and 3, illustrations thereof will be omitted. That is, the PSD in FIG. 1 differs from the PSD in FIG. 7 only in the shapes of the upper surfaces of resistive regions $P_N$. A width Y of the resistive region $P_N$ and a lengthwise position X have a relation of Y=aX²+b. The width Y of resistive regions $P_1$ to $P_{20}$ is a quadratic function of the position X along the lengthwise direction from one end of the resistive region $P_N$. In this case, the incident light position X and the relative photocurrent output (%) have the relationship shown in FIG. 8. Assume that a total length C of the resistive region $P_N$ is 1,000 μm, and the width Y and position X satisfy Y=0.001X²+10(μm). If a ratio R2=I2/(I1+I2) is calculated, the incident light position X is given by $$X = \sqrt{b/a} \times \tan(R2 \times \tan^{-1}(C/\sqrt{b/a})) \qquad (4)$$

In this case, upon computing the ratio R2 from the output currents I1 and I2, an arithmetic unit 104 computes the position X and searches for a distance L corresponding to the position X in a memory storing a table indicating the relationship between the distance L and position X calculated in advance, thereby obtaining the distance L.

Since the incident light position X has the following relationship, the distance L may be calculated by the equation given above after the position X is directly computed from the equation given below:

$$X = \sqrt{b/a} \times \tan\left(\frac{I2}{I1 \times I2} \times \tan^{-1}(C/\sqrt{b/a})\right) \qquad (5)$$

Figure 9:
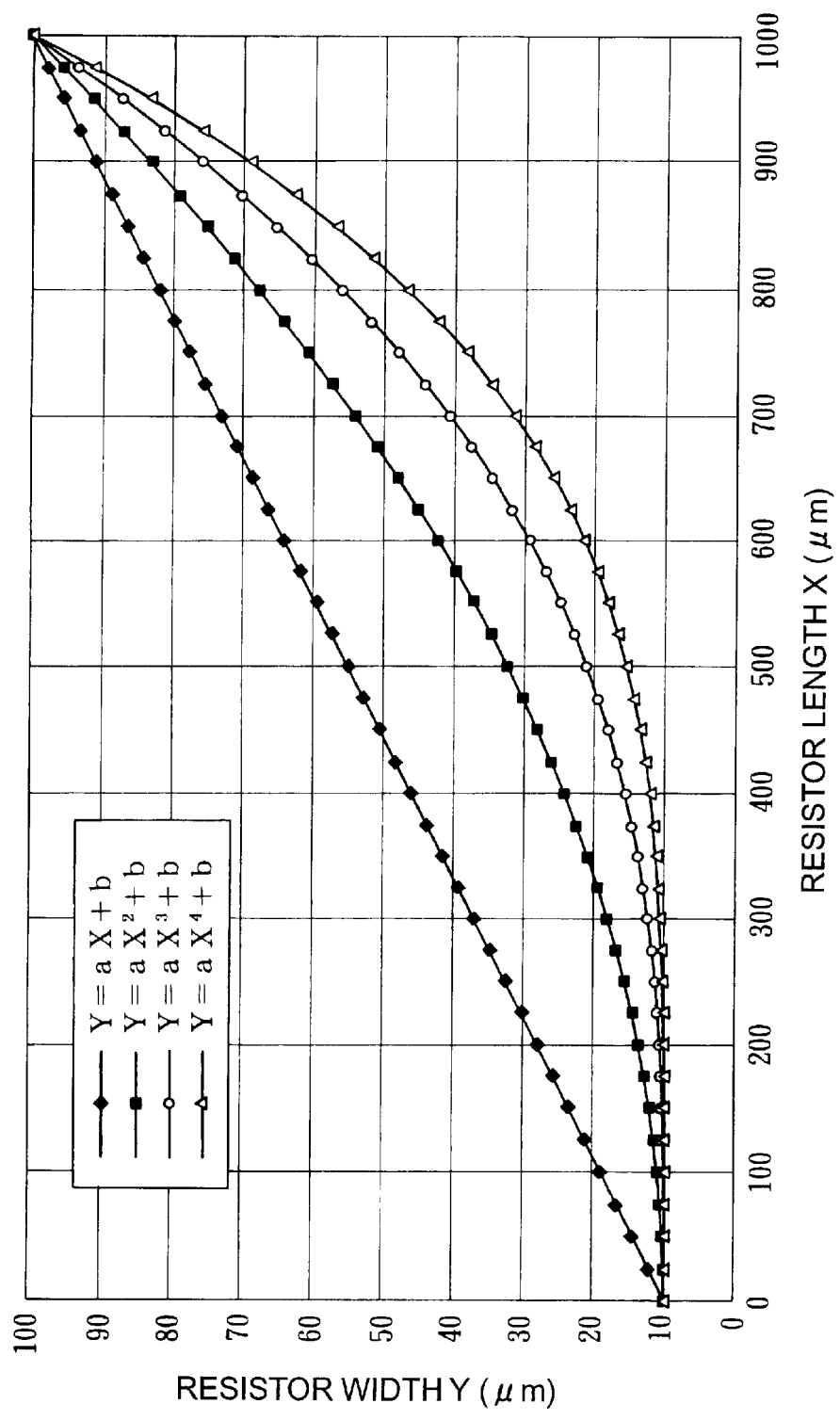
FIG. 9 is a graph showing the relationship between the resistor length ($\mu$m) and the resistor width ($\mu$m)

FIG. 9 is a graph showing the relationship between the lengthwise position (resistor length) X and the width (resistor width) Y of the resistive region $P_N$. The total length C of the resistive region $P_N$ is 1,000 μm, the minimum value of the width Y of the resistive region $P_N$ on the long distance side (close to X=0) is 10 μm, and the maximum value of the width Y of the resistive region $P_N$ on the short distance side (far from X=0) is 100 μm. If the width Y is a linear function (Y=aX+b) of the position X, the widths Y at X=100 μm and 200 μm are 19 μm and 28 μm, respectively. If the width Y is a quadratic function (Y)=aX²+b) of the position X, the widths Y at X=100 μm and 200 μm are 10.9 μm and 13.6 μm, respectively. If the width Y of the resistive region $P_N$ and lengthwise position X satisfy the relationship of a linear function (Y=aX+b) or quadratic function (Y=aX²+b), Y greatly changes with a change in X on the long distance side. Assume that X and Y satisfy such a relationship. In this case, therefore, since the rate of change in the width Y is high, a resistive region $P_N$ having required characteristics can be manufactured.

If, however, the width Y and position X satisfy a relationship of a cubic function (Y=aX³+b), the widths Y at X=100 μm and 200 μm are 10.9 μm and 10.72 μm, respectively. If the width Y and position X satisfy a relationship of a quartic function (Y=aX⁴+b), the widths Y at X=100 μm and 200 μm are 10.009 μm and 10.144 μm, respectively. That is, a change in the width Y with a change in the lengthwise position X considerably decreases.

If, therefore, the width Y and lengthwise position X satisfy a relationship of a cubic function or higher, the width Y must be controlled with very high precision. If the resistive region $P_N$ is manufactured with a normal precision, the position detection precision becomes low.

If the value a is set such that the width Y at X=100 μm in the case wherein the above relationship of a cubic or quartic function is satisfied becomes equal to that in the case wherein the relationship of a quadratic function is satisfied, i.e., Y=10.9 μm, the widths Y on the short distance side (far from X=0) become as large as 910 μm and 9,010 μm, respectively. That is, if the width Y and lengthwise position X satisfy a relationship of a cubic function or higher, the size of a PSD must be greatly increased.

In the PSD according to the above embodiment, the width Y of the resistive region $P_N$ and the lengthwise position X satisfy a relationship of a linear or quadratic function. Therefore, the area of a surface can be increased without increasing the size of the PSD and decreasing the precision of the resistive region width. This makes it possible to improve the position detection precision of these PSDs.

(Third Embodiment)

Figure 10:
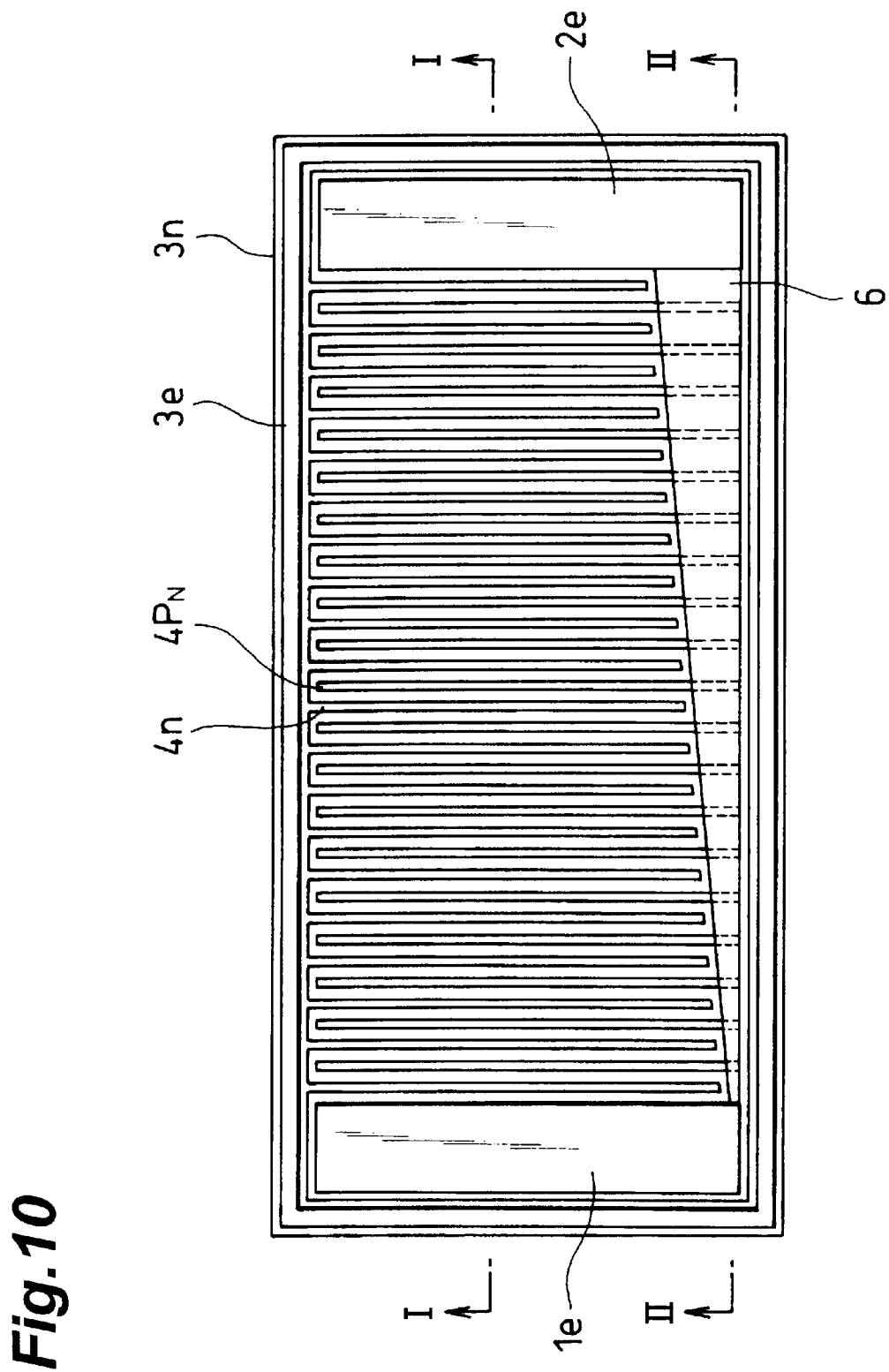
FIG. 10 is a top view of a PSD according to the third embodiment.
Figure 11:
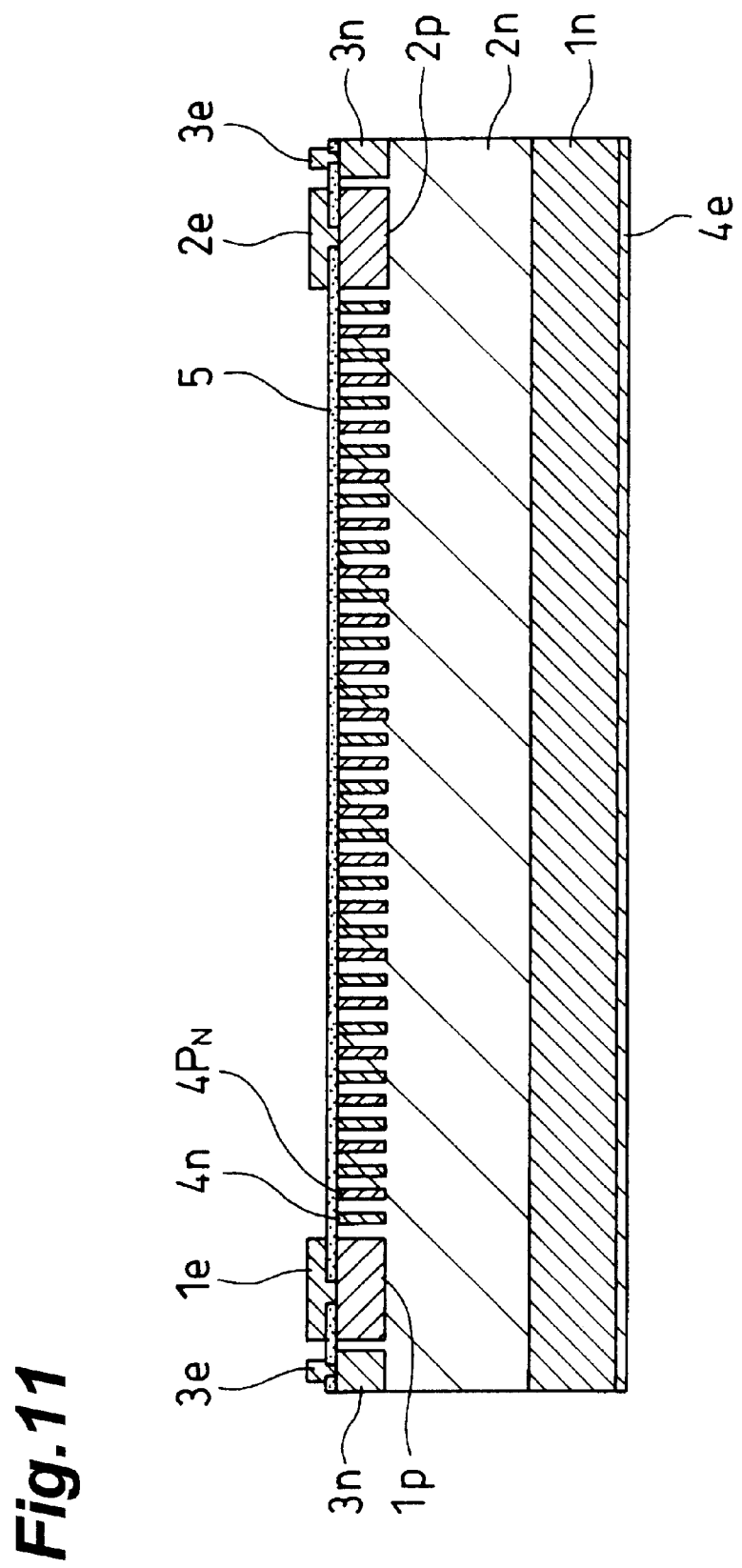
FIG. 11 is a sectional view taken along an arrow I—I of the PSD in FIG. 10.
Figure 12:
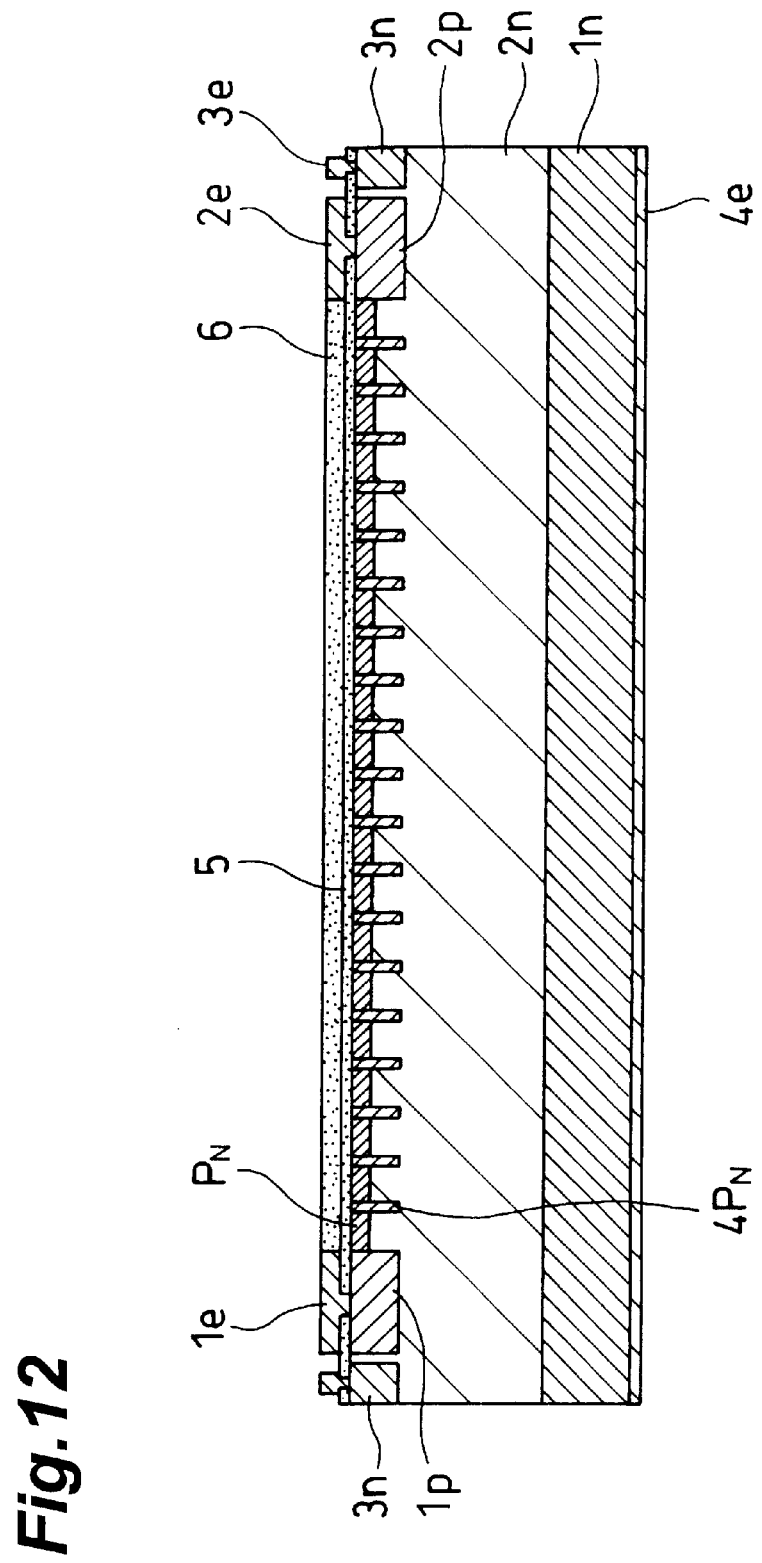
FIG. 12 is a sectional view taken along an arrow II—II of the PSD in FIG. 10.

FIG. 10 is a top view of a PSD according to the third embodiment. FIG. 11 is a sectional view taken along an arrow I—I of the PSD in FIG. 10. FIG. 12 is a sectional view taken along an arrow II—II of the PSD in FIG. 10. The PSD according to this embodiment is obtained by adding a light-shielding film 6 to the PSD according to the first embodiment. The light-shielding film 6 is formed on a resistive region $P_N$ to shield the resistive region $P_N$ against incident light.

When the resistive region $P_N$ of the PSD of the first embodiment is irradiated with light, the computed incident light position may deviate from the true value depending on the shape of light. This semiconductor position sensitive detector therefore further comprises the light-shielding film 6 formed on the resistive region $P_N$ to improve the position detection precision. Note that the light-shielding film 6 can also be applied to the PSD of the second embodiment, in which the width Y of the resistive region $P_N$ is defined as a quadratic function of the position X.

The light-shielding film 6 is made of a photosensitive resin containing a black pigment or dye, i.e., a black photoresist. Since the light-shielding film 6 is an insulating member, even if the entire region of the upper surface of the resistive region $P_N$ is covered with the light-shielding film 6, signal extraction electrodes 1e and 2e do not electrically short-circuit. In addition, since the light-shielding film 6 itself is made of a black photoresist, it can be formed by only coating the entire surface of the PSD with a photoresist, irradiating it with exposure light with a predetermined pattern, and developing the pattern. Therefore, the light-shielding film 6 can be easily formed.

(Fourth Embodiment)

Figure 13:
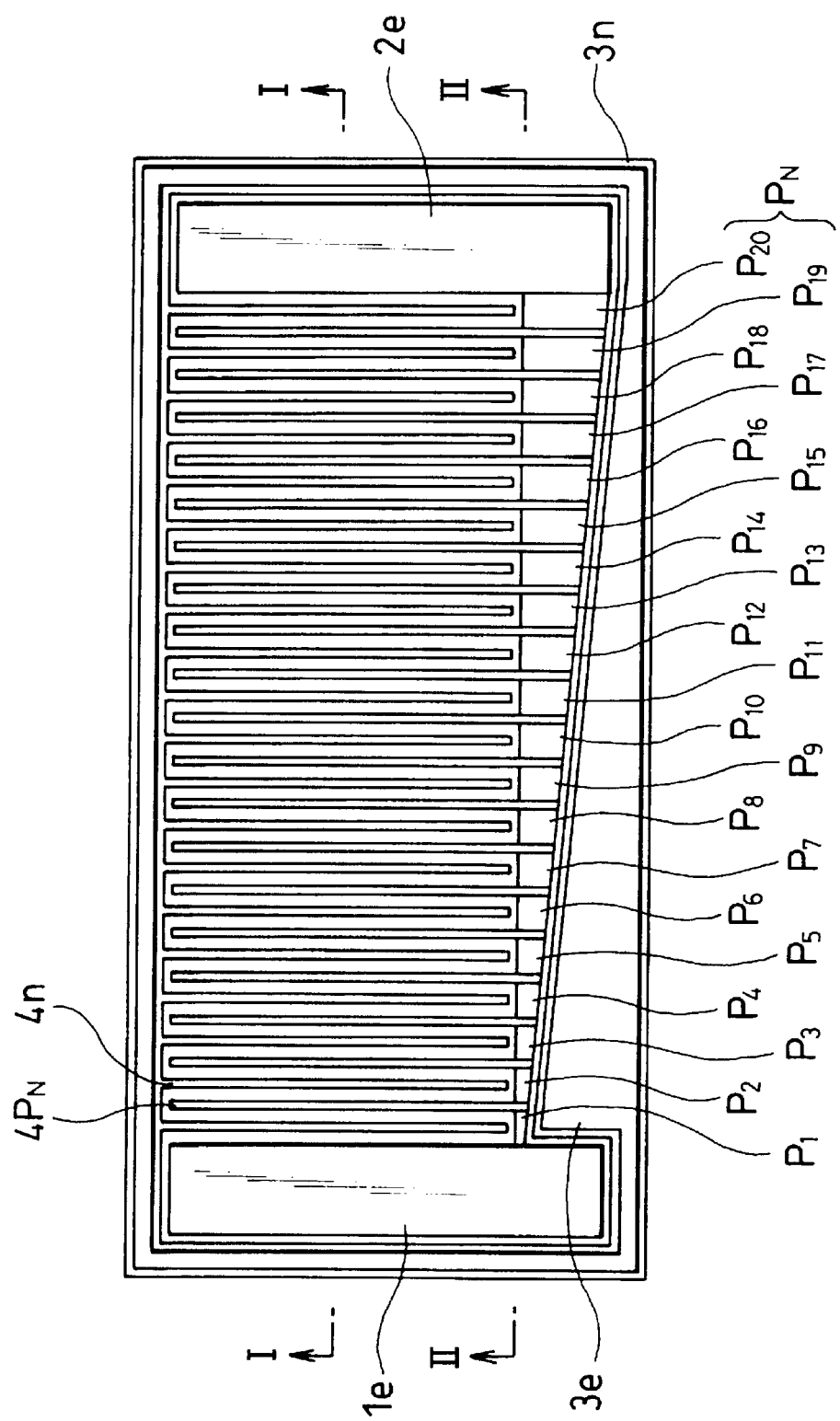
FIG. 13 is a top view of a PSD according to the fourth embodiment.
Figure 14:
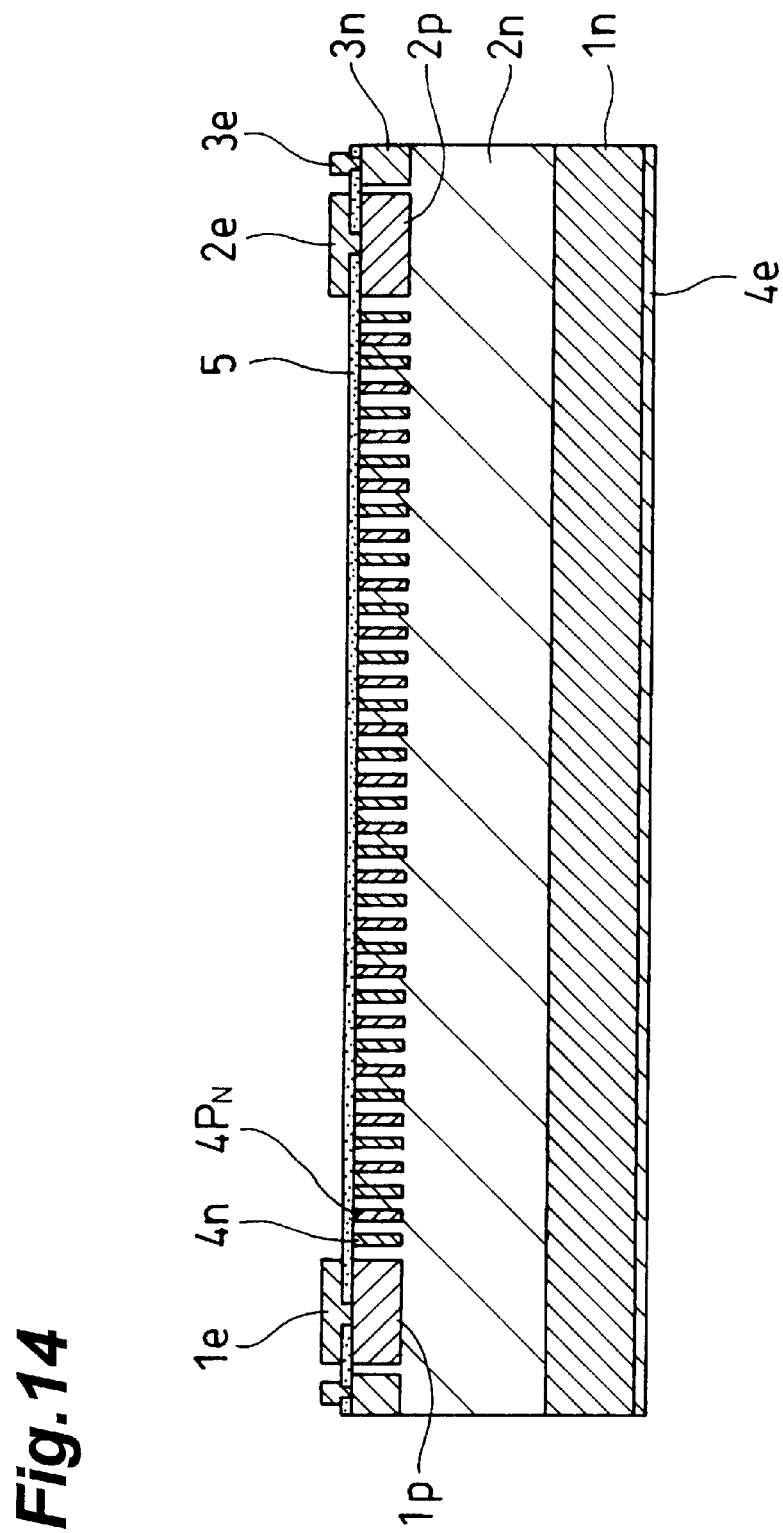
FIG. 14 is a sectional view taken along an arrow I—I of the PSD in FIG. 13.
Figure 15:
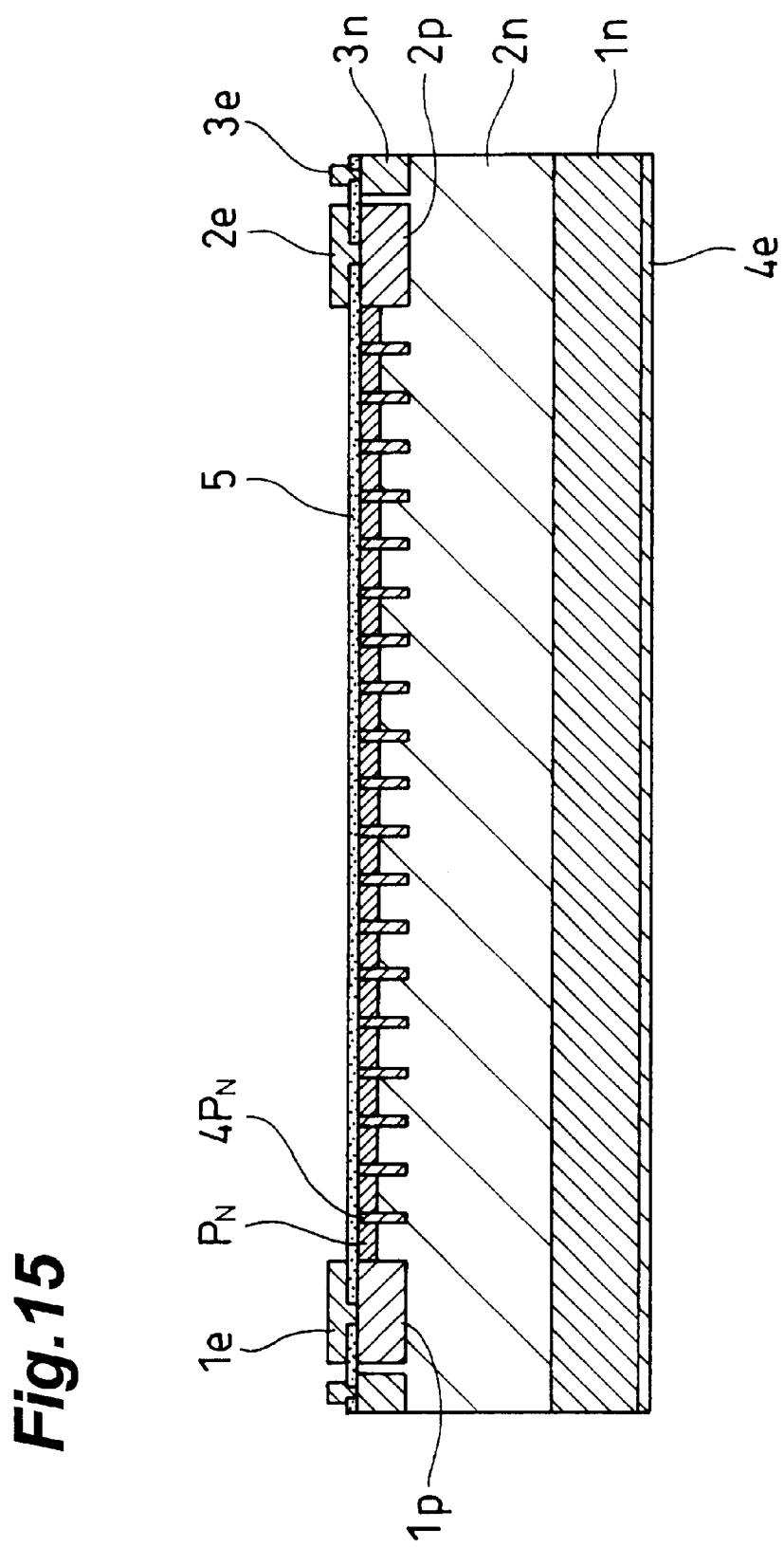
FIG. 15 is a sectional view taken along an arrow II—II of the PSD in FIG. 13.

FIG. 13 is a top view of a PSD according to the fourth embodiment. FIG. 14 is a sectional view taken along an arrow I—I of the PSD in FIG. 13. FIG. 15 is a sectional view taken along an arrow II—II of the PSD in FIG. 13. The PSD of this embodiment is obtained by changing the surface shapes of the resistive regions $P_1$ to $P_{20}$ of the resistive region $P_N$ the shapes of the outer frame semiconductor layer 3n and outer frame electrode 3e, and the length of the conductive strips $4P_N$ in the widthwise direction Y of the PSD according to the first embodiment.

Resistive regions $P_1$ to $P_{20}$ of a resistive region $P_N$ of this PSD have trapezoidal surfaces. These sides of the trapezoidal surfaces of the resistive regions $P_1$ to $P_{20}$, which are located on the surface side are parallel to a lengthwise direction X of the PSD and located on the same straight line. Those sides of the resistive regions $P_1$ to $P_{20}$ which are located on the outer edge side of the rectangular surface of the PSD cross the lengthwise direction X at a predetermined angle. The width Y of the resistive region $P_N$ and the lengthwise position X have a relation of Y=−aX−b. In addition, that inner side of the rectangular outer frame semiconductor layer 3n, which is adjacent to the resistive region $P_N$ is parallel to that side of the resistive region $P_N$ which is located on the outer edge side of the rectangular surface of the PSD, i.e., straight line Y=−aX−b. In the PSD of this embodiment, the distance from that side of the resistive region $P_N$ which is located on the surface side to the distal end of each branch conductive layer $4P_N$ is constant. Therefore, the resistance values between those sides of the respective conductive strips $4P_N$, which are located on the surface side of the resistive region $P_N$ and the distal ends are almost constant. This makes it possible to suppress a decrease in position detection precision due to variations in the resistance values of the conductive strips $4P_N$ in the widthwise direction Y. An inner side of the outer frame electrode 3e is brought close to the resistive region $P_N$ in accordance with the shape of the resistive region $P_N$. This makes the outer frame electrode 3e block disturbance light incident on the outside of the resistive region $P_N$ thereby further suppressing a decrease in position detection precision due to such disturbance light.

(Fifth Embodiment)

Figure 16:
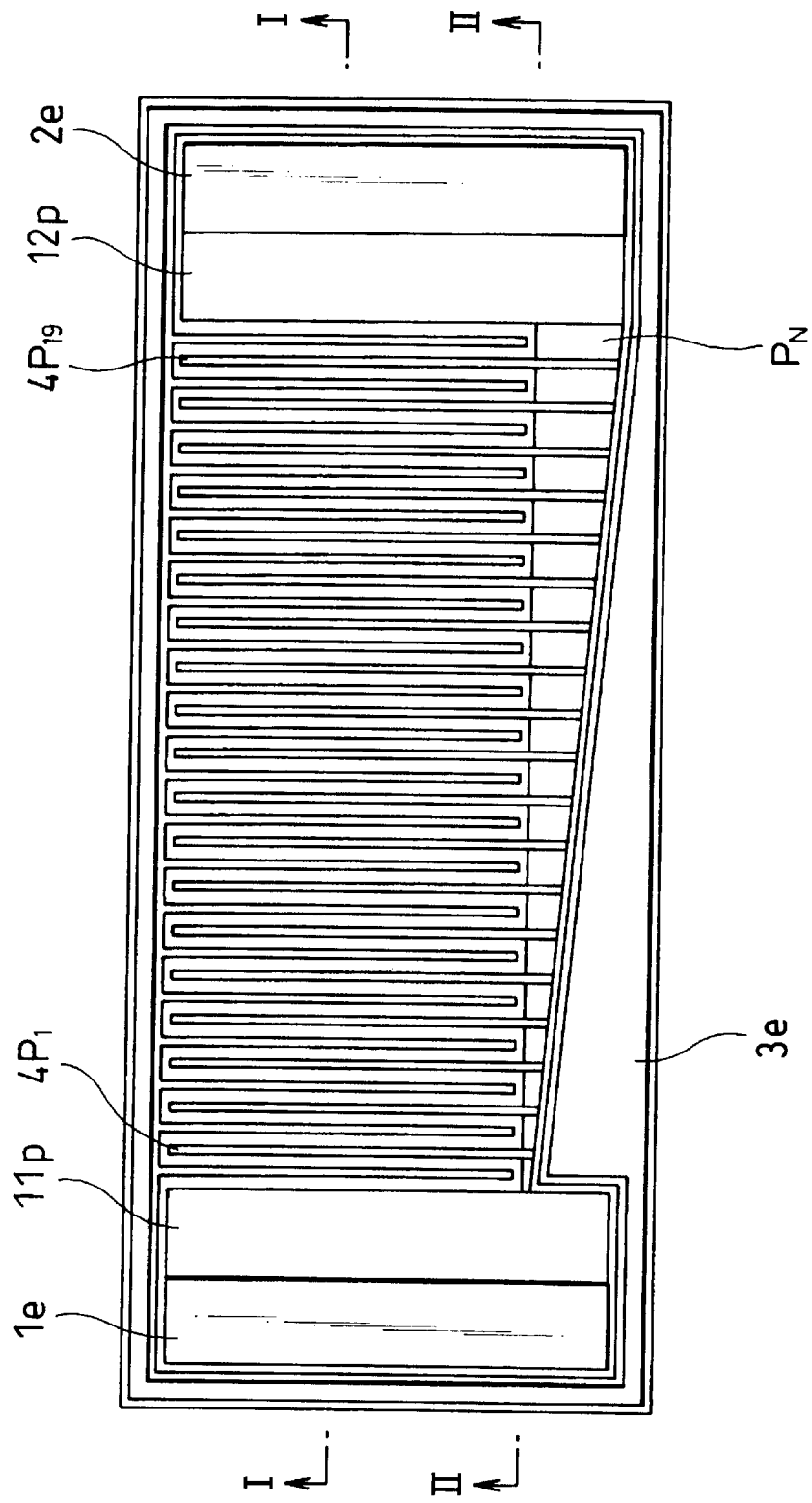
FIG. 16 is a top view of a PSD according to the fifth embodiment.
Figure 17:
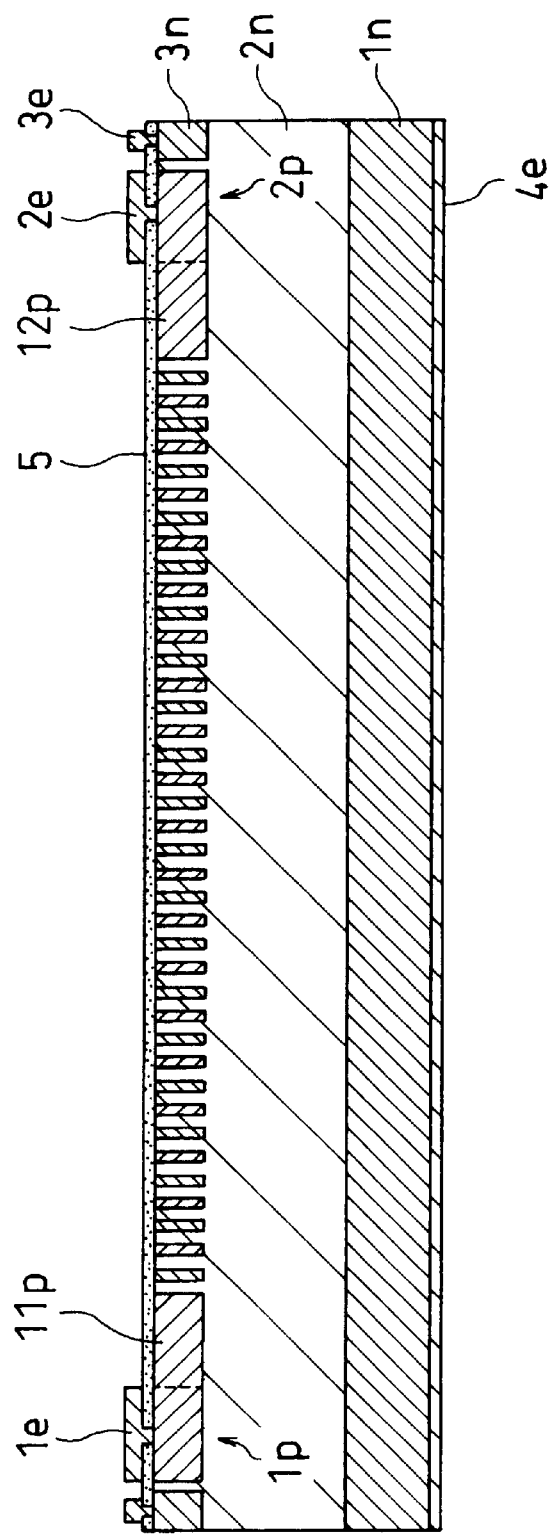
FIG. 17 is a sectional view taken along an arrow I—I of the PSD in FIG. 16.
Figure 18:
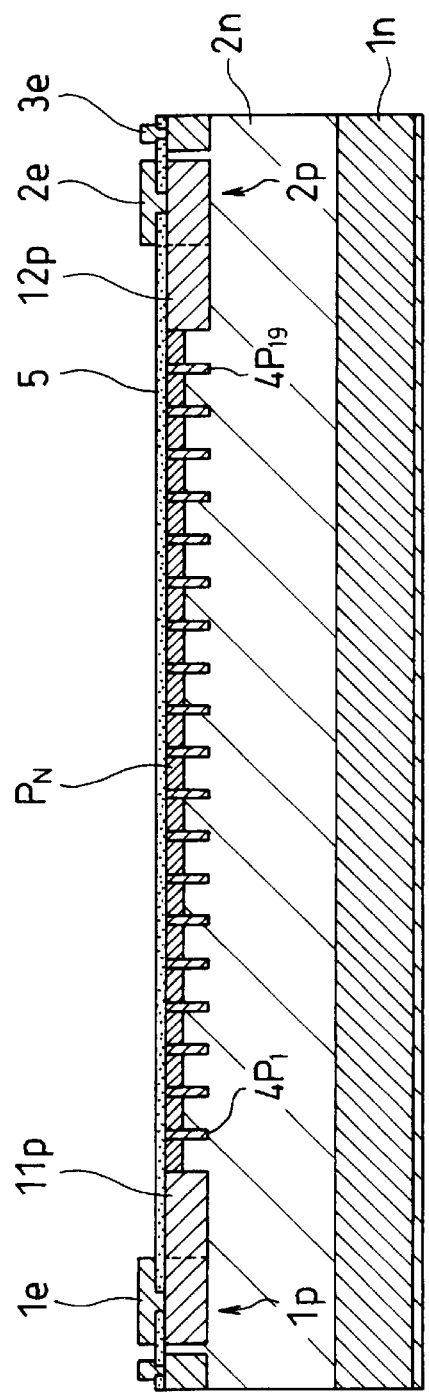
FIG. 18 is a sectional view taken along an arrow II—II of the PSD in FIG. 16.

FIG. 16 is a top view of a PSD according to the fifth embodiment. FIG. 17 is a sectional view taken along an arrow I—I of the PSD in FIG. 16. FIG. 18 is a sectional view taken along an arrow II—II of the PSD in FIG. 16. The PSD of this embodiment is obtained by forming predetermined regions between the signal extraction electrodes 1e and 2e and the outermost conductive strips $4P_1$ and $4P_{19}$ of the PSD of the fourth embodiment, and forming signal extraction semiconductor layers 1p and 2p running immediately below the signal extraction electrodes 1e and 2e. Note that the signal extraction electrodes 1e and 2e are not formed immediately below semiconductor regions 11p and 12p which spread from the signal extraction semiconductor layers 1p and 2p and hence light can reach the semiconductor regions 11p and 12p. The semiconductor regions 11p and 12p are spaced apart from the outermost conductive strips $4P_1$ and $4P_{19}$ by a predetermined distance, and run along the widthwise direction Y parallel to the conductive strips. When, therefore, light is incident on the semiconductor regions 11p and 12p charges generated and collected in the semiconductor regions 11p and 12p, which flow into the signal extraction electrodes 1e and 2e near the semiconductor regions 11p and 12p are extracted from the signal extraction electrodes 1e and 2e without the mediacy of the resistive region $P_N$.

In the PSD of the fourth embodiment, when light is incident as spot light near the outermost conductive strips $4P_1$ and $4P_{19}$ of the PSD, since the spots are partly blocked by the signal extraction electrodes 1e and 2e the barycentric positions of the incident light beams deviate in accordance with the blocked spot portions. According to the PSD of this embodiment, even in such a case, charges generated by spot light can be collected in the semiconductor regions 11p and 12p, and hence the position detection precision of the PSD can be further improved.

(Sixth Embodiment)

Figure 19:
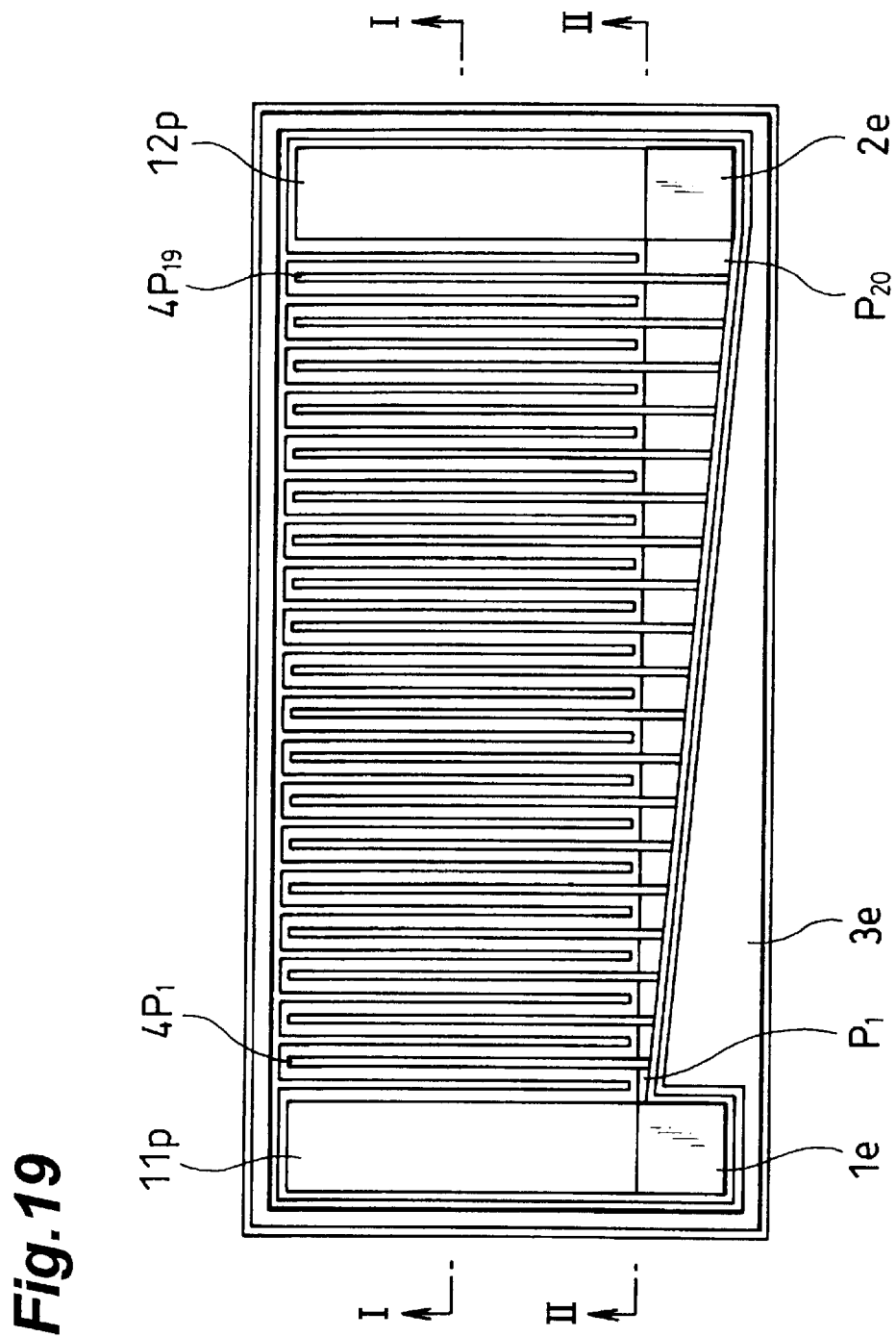
FIG. 19 is a top view of a PSD according to the sixth embodiment.
Figure 20:
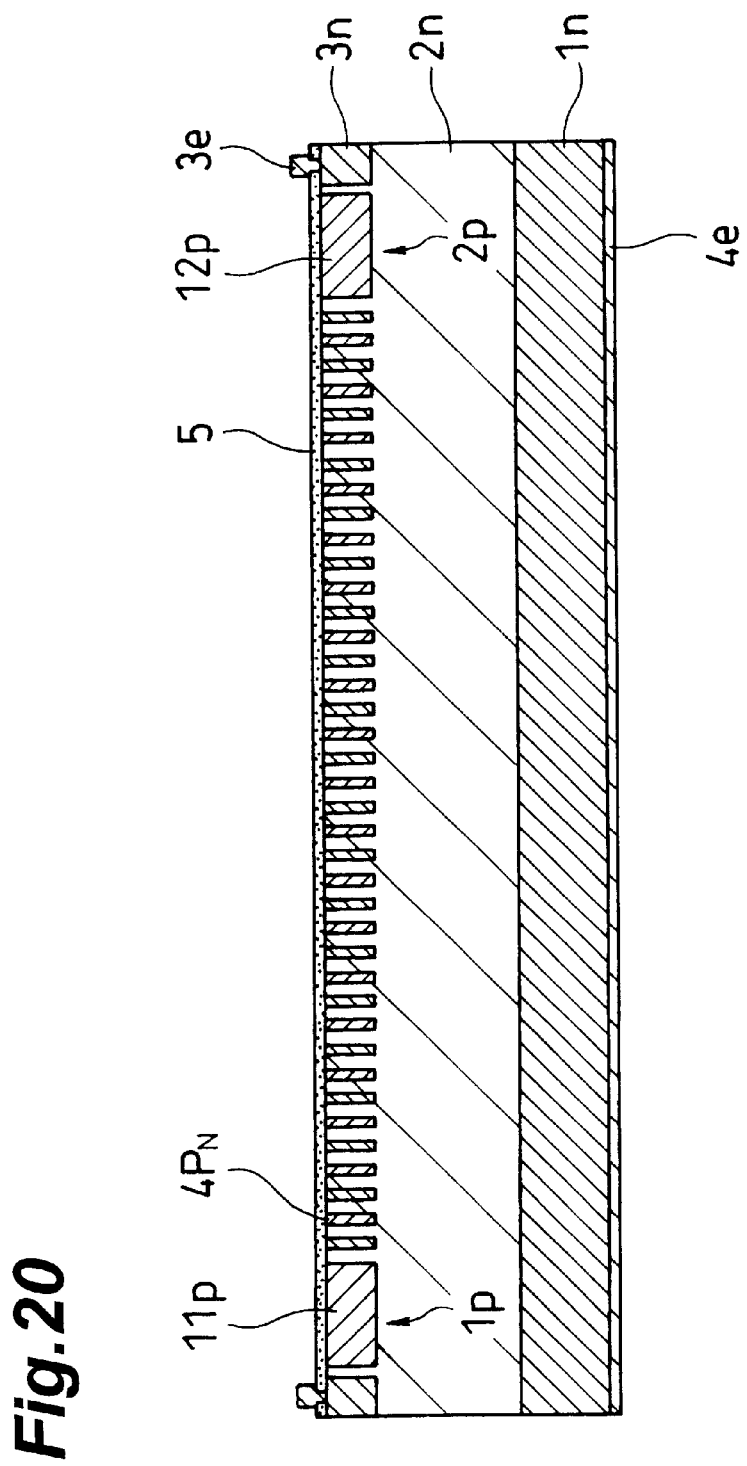
FIG. 20 is a sectional view taken along an arrow I—I of the PSD in FIG. 19.
Figure 21:
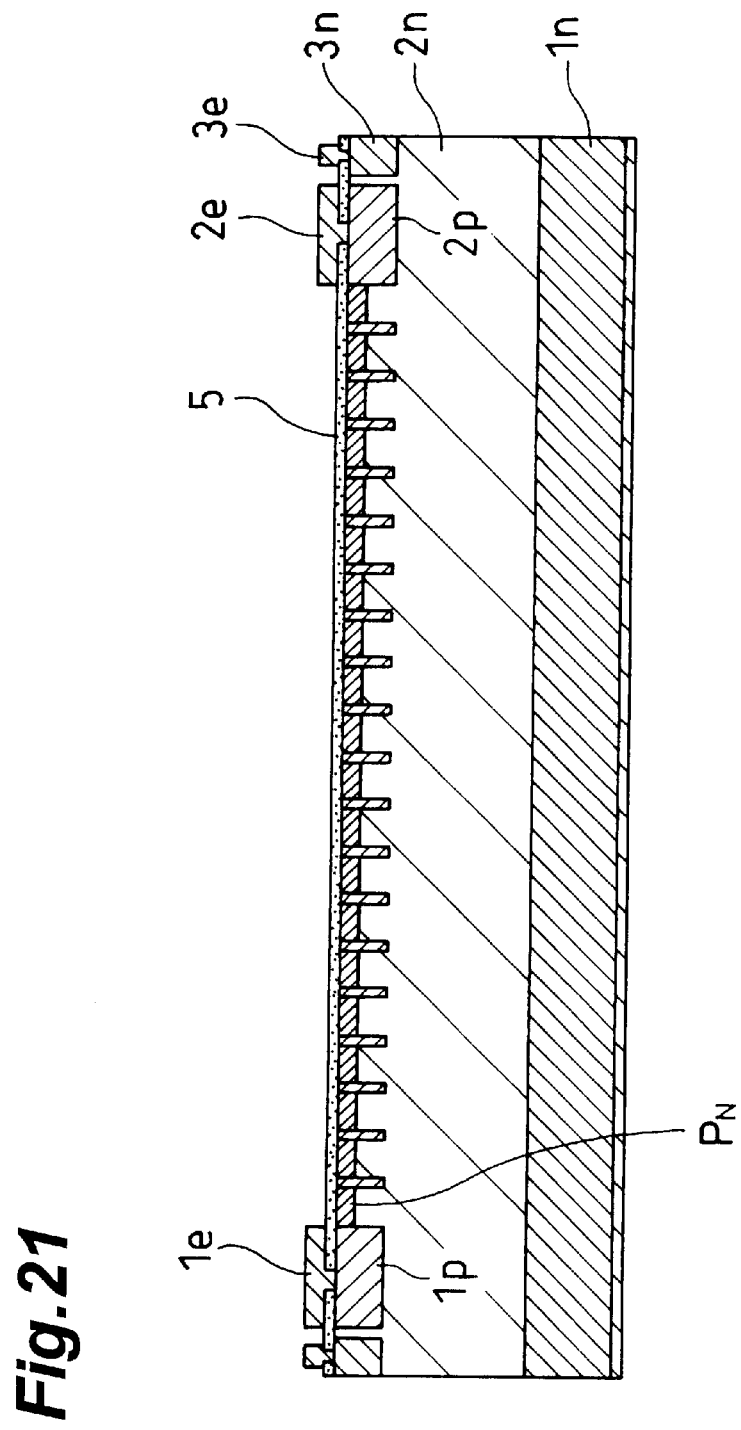
FIG. 21 is a sectional view taken along an arrow II—II of the PSD in FIG. 19.

FIG. 19 is a top view of a PSD according to the sixth embodiment. FIG. 20 is a sectional view taken along an arrow I—I of the PSD in FIG. 19. FIG. 21 is a sectional view taken along an arrow II—II of the PSD in FIG. 19. The PSD according to this embodiment is obtained by partly removing the signal extraction electrodes 1e and 2e of the PSD of the fourth embodiment, and using signal extraction semiconductor layers 1p and 2p immediately below the removed portions of the signal extraction electrodes 1e and 2e as semiconductor regions 11p and 12p. Light can enter the semiconductor regions 11p and 12p. The semiconductor regions 11p and 12p are spaced apart from outermost conductive strips $4P_1$ and $4P_{19}$ by a predetermined distance and run parallel along a widthwise direction Y parallel to the conductive strips. When, therefore, light is incident on the semiconductor regions 11p and 12p, charges, of charges generated and collected in the semiconductor regions 11p and 12p, which flow into the signal extraction electrodes 1e and 2e near the semiconductor regions 11p and 12p are extracted from the signal extraction electrodes 1e and 2e without the mediacy of the resistive region $P_N$.

In the PSD of the fourth embodiment, when light is incident as spot light near the outermost conductive strips $4P_1$ and $4P_{19}$ of the PSD, since the spots are partly blocked by the signal extraction electrodes 1e and 2e, the barycentric positions of the incident light beams deviate in accordance with the blocked spot portions. According to the PSD of this embodiment, even in such a case, charges generated by spot light can be collected in the semiconductor regions 11p and 12p, and hence the position detection precision of the PSD can be further improved.

Although the signal extraction electrodes 1e and 2e are formed on the extension lines of the two ends of a resistive region $P_N$ in a lengthwise direction X, these electrodes are not formed on the extension lines of the two ends of the surface, on which conductive strips $4P_N$ are formed, in the lengthwise direction X. By forming the signal extraction electrodes 1e and 2e in this manner, the length of the PSD in the lengthwise direction X can be decreased, and the PSD can be reduced in size as compared with the PSD of the fifth embodiment.

(Seventh Embodiment)

Figure 22:
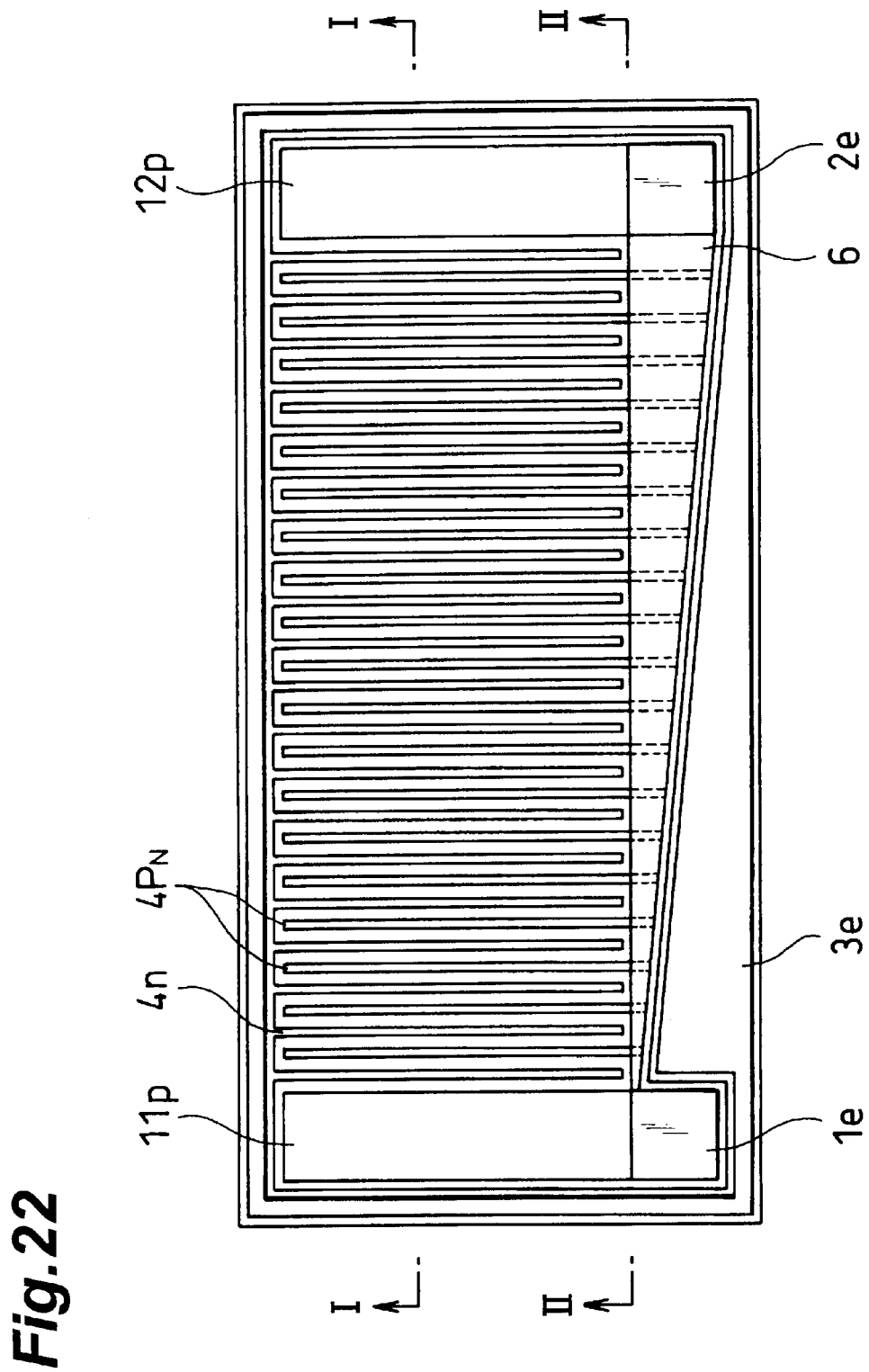
FIG. 22 is a top view of a PSD according to the seventh embodiment.
Figure 23:
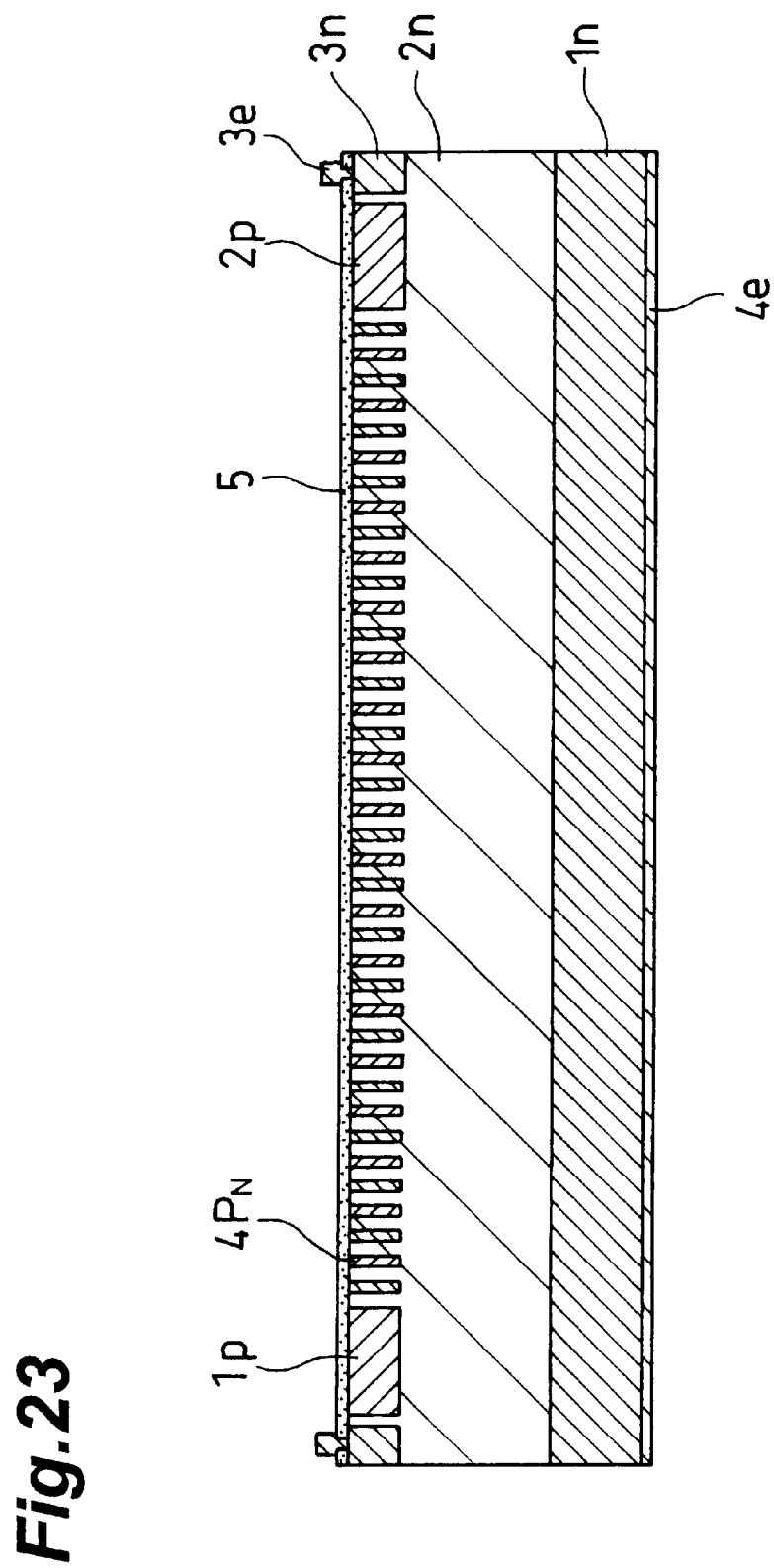
FIG. 23 is a sectional view taken along an arrow I—I of the PSD in FIG. 22.
Figure 24:
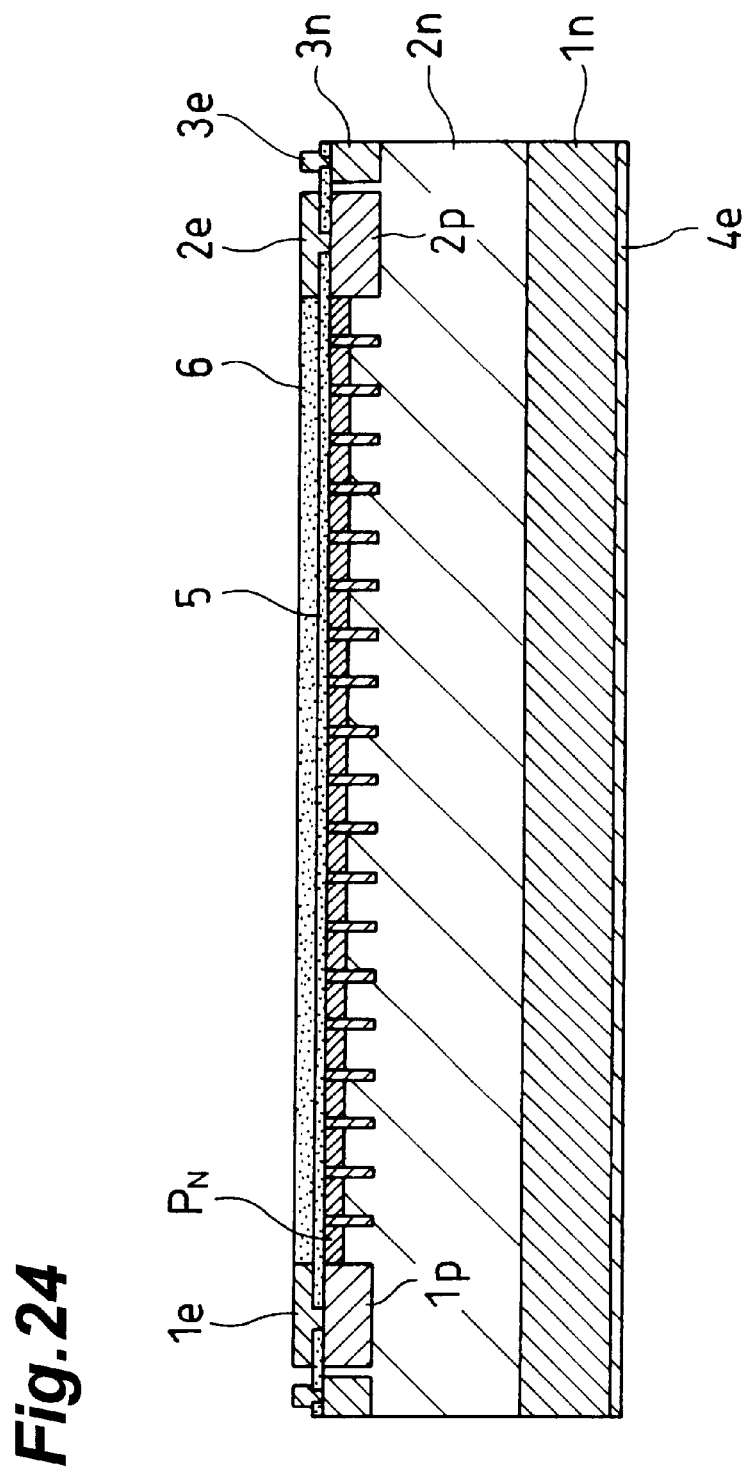
FIG. 24 is a sectional view taken along an arrow II—II of the PSD in FIG. 22.

FIG. 22 is a top view of a PSD according to the seventh embodiment. FIG. 23 is a sectional view taken along an arrow I—I of the PSD in FIG. 22. FIG. 24 is a sectional view taken along an arrow II—II of the PSD in FIG. 22. The PSD of this embodiment is obtained by forming a light-shielding film 6 on the resistive region $P_N$ of the PSD of the sixth embodiment. The light-shielding film 6 is made of a photosensitive resin containing a black pigment or dye, i.e., a black photoresist.

(Eighth Embodiment)

Figure 25:
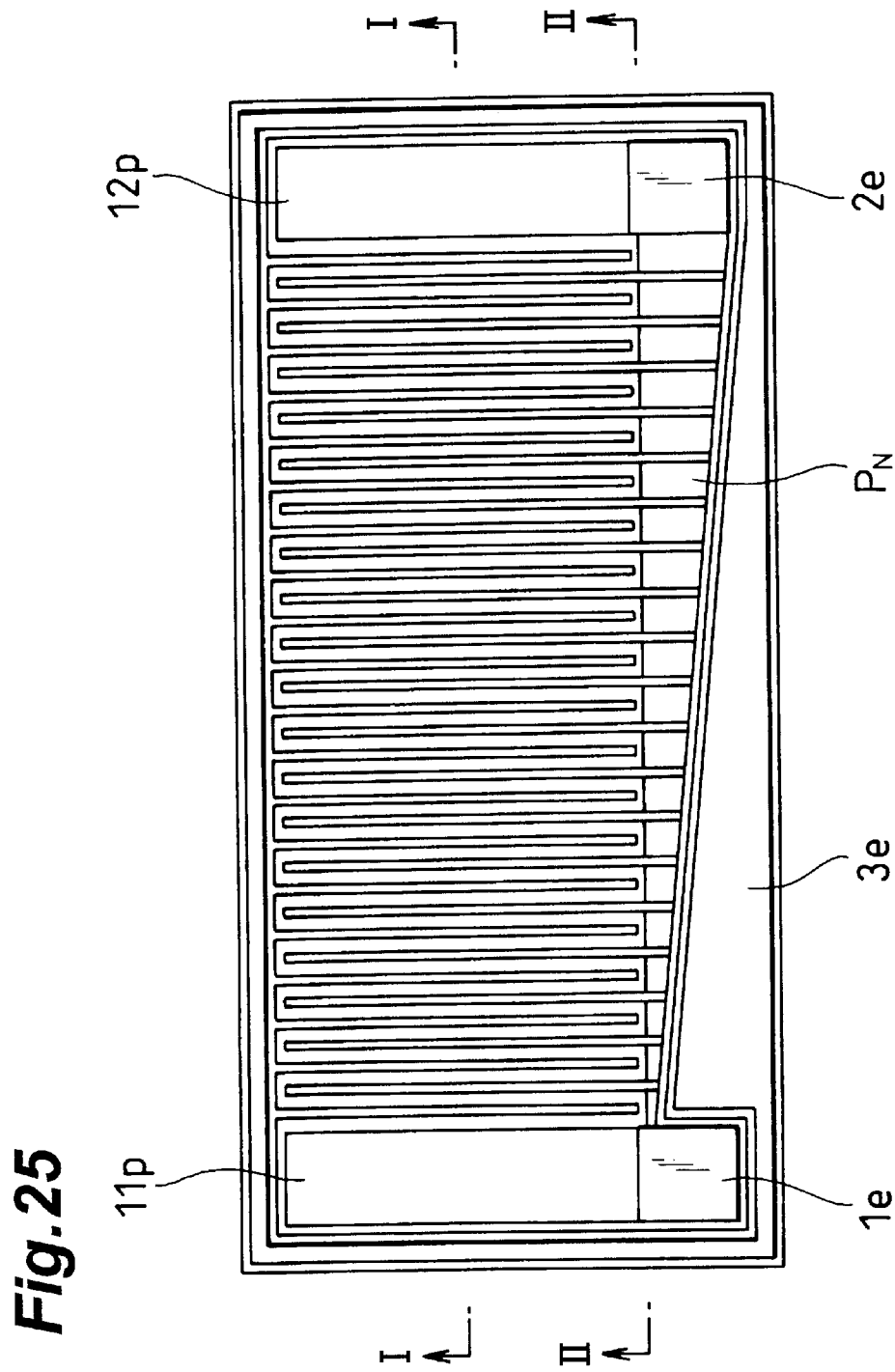
FIG. 25 is a top view of a PSD according to the eighth embodiment.
Figure 26:
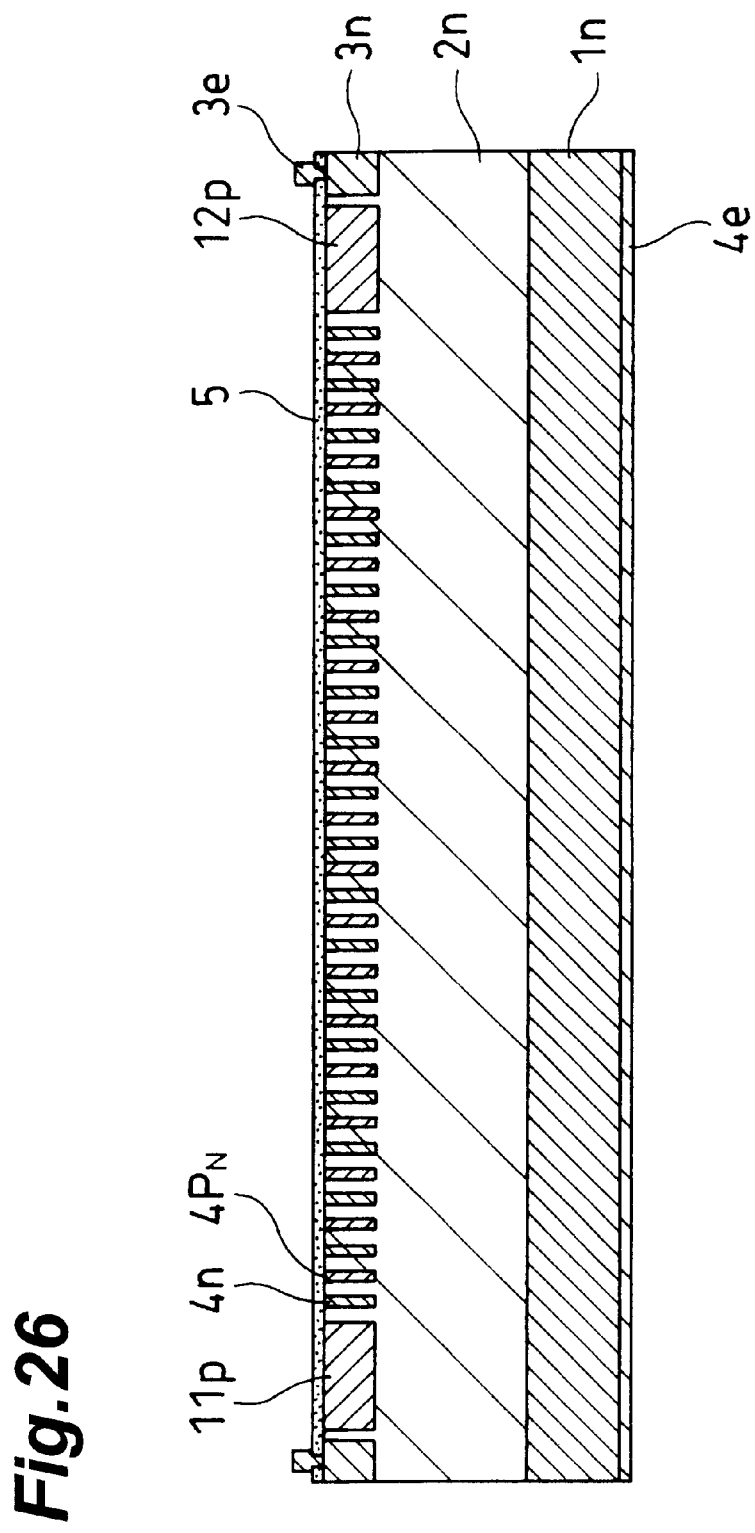
FIG. 26 is a sectional view taken along an arrow I—I of the PSD in FIG. 25.
Figure 27:
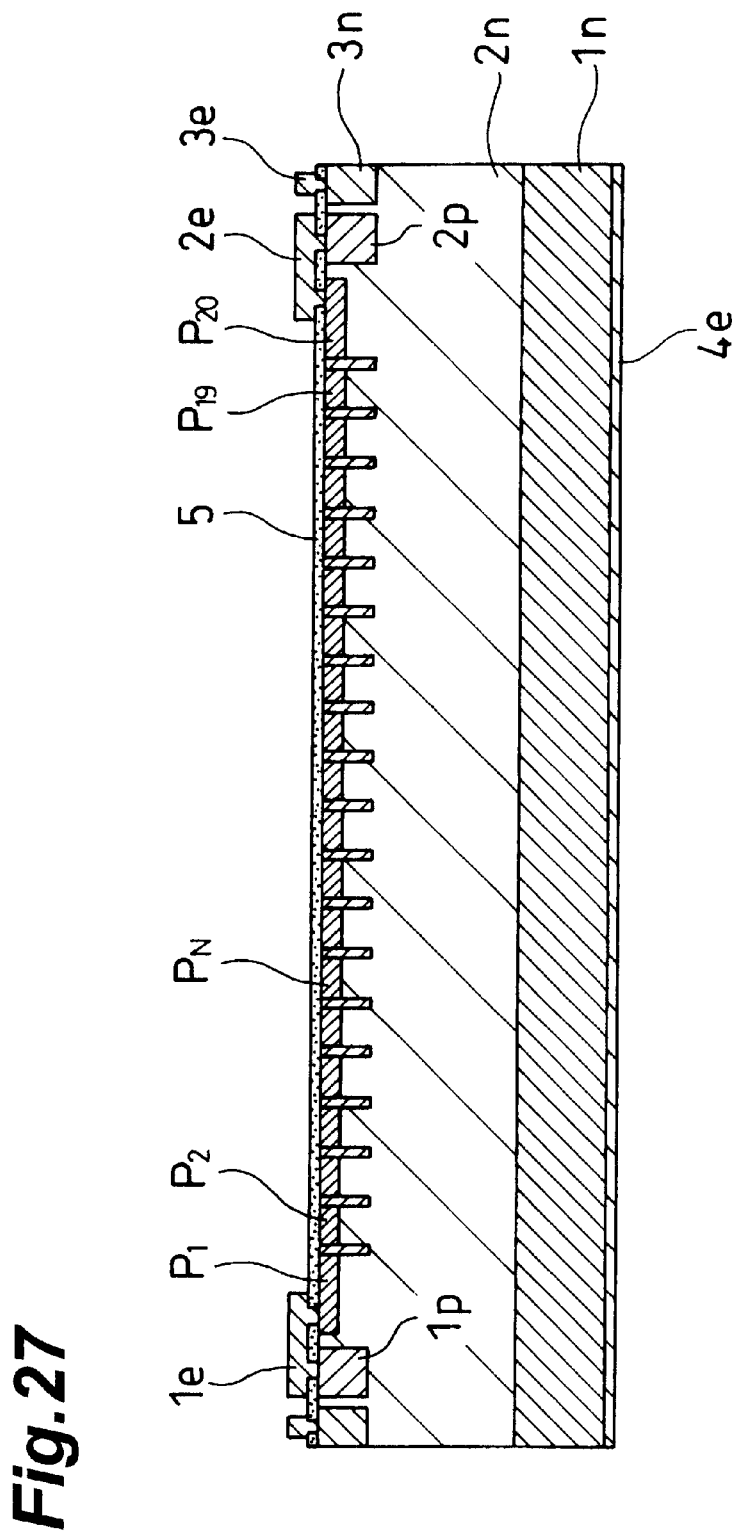
FIG. 27 is a sectional view taken along an arrow II—II of the PSD in FIG. 25.

FIG. 25 is a top view of a PSD according to the eighth embodiment. FIG. 26 is a sectional view taken along an arrow I—I of the PSD in FIG. 25. FIG. 27 is a sectional view taken along an arrow II—II of the PSD in FIG. 25. The PSD of this embodiment is obtained by forming signal extraction electrodes 1e and 2e to make them spread over the resistive regions $P_1$ and $P_{20}$ and signal extraction semiconductor layers 1p and 2p located on the two end portions of a resistive region $P_N$ of the PSD of the sixth embodiment in the lengthwise direction X. The resistive regions $P_1$ and $P_{20}$ on the two ends are directly connected to the signal extraction electrodes 1e and 2e, respectively. In addition, semiconductor regions 11p and 12p are directly connected to the signal extraction electrodes 1e and 2e, respectively. According to this PSD, charges from the resistive region $P_N$ and charges collected in the semiconductor regions 11p and 12p can be extracted from the signal extraction electrodes 1e and 2e.

(Ninth Embodiment)

Figure 28:
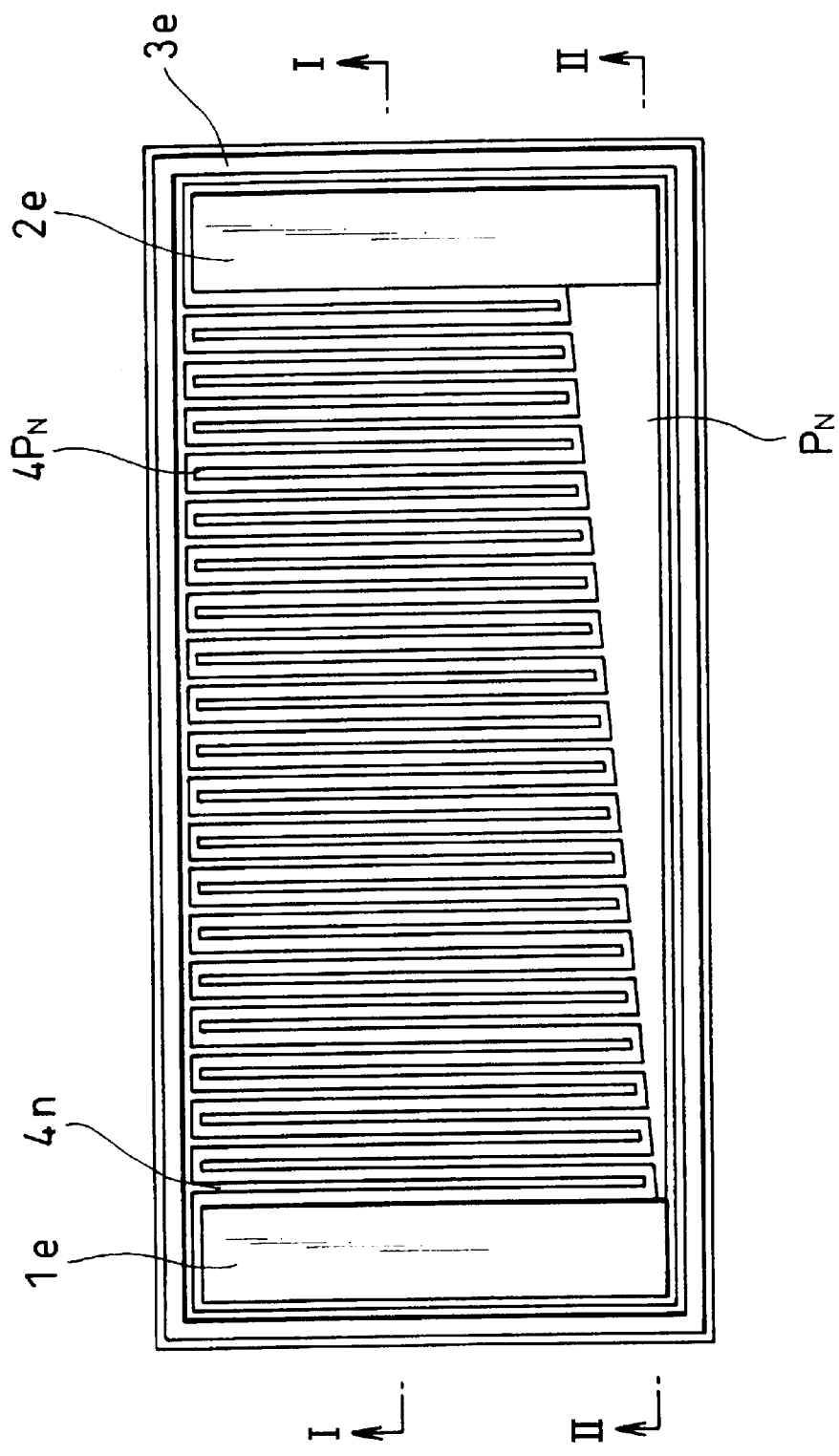
FIG. 28 is a top view of a PSD according to the ninth embodiment.
Figure 29:
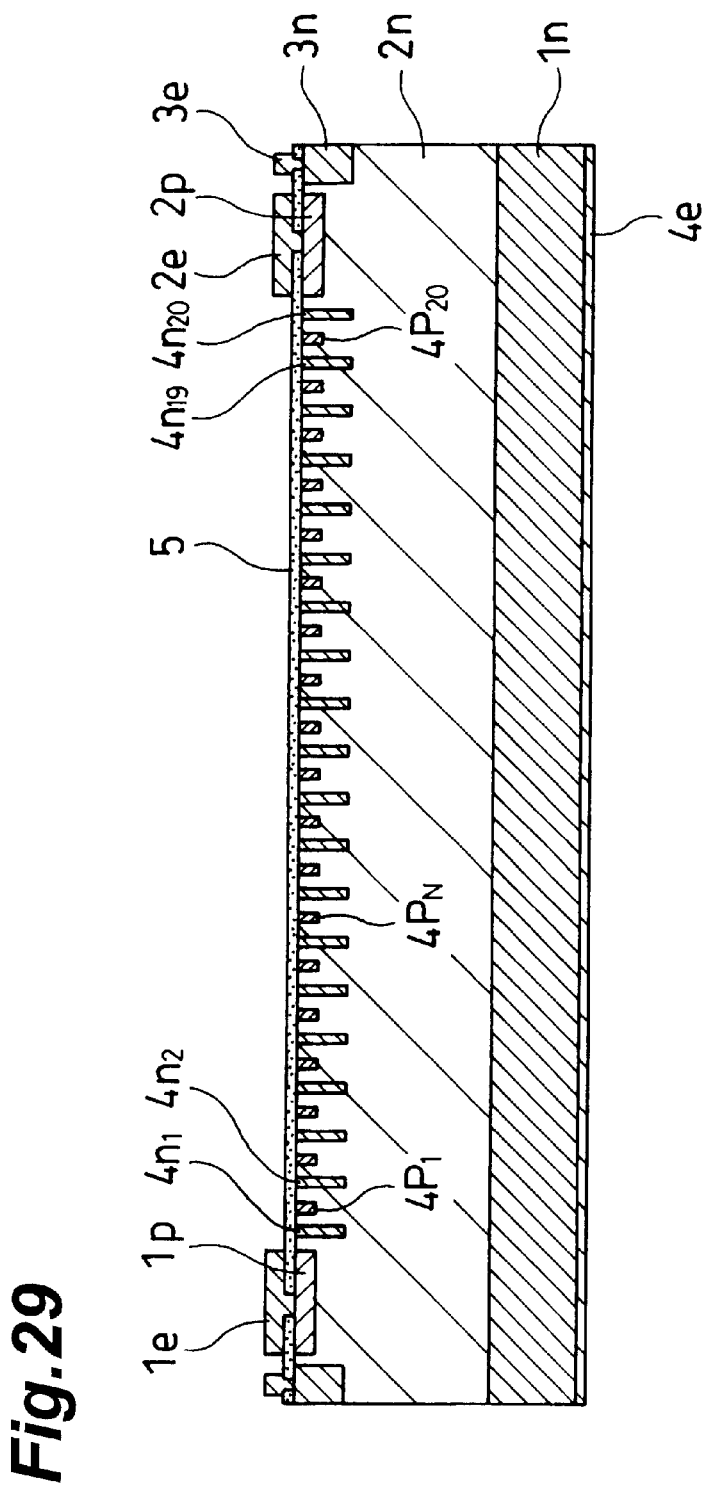
FIG. 29 is a sectional view taken along an arrow I—I of the PSD in FIG. 28.
Figure 30:
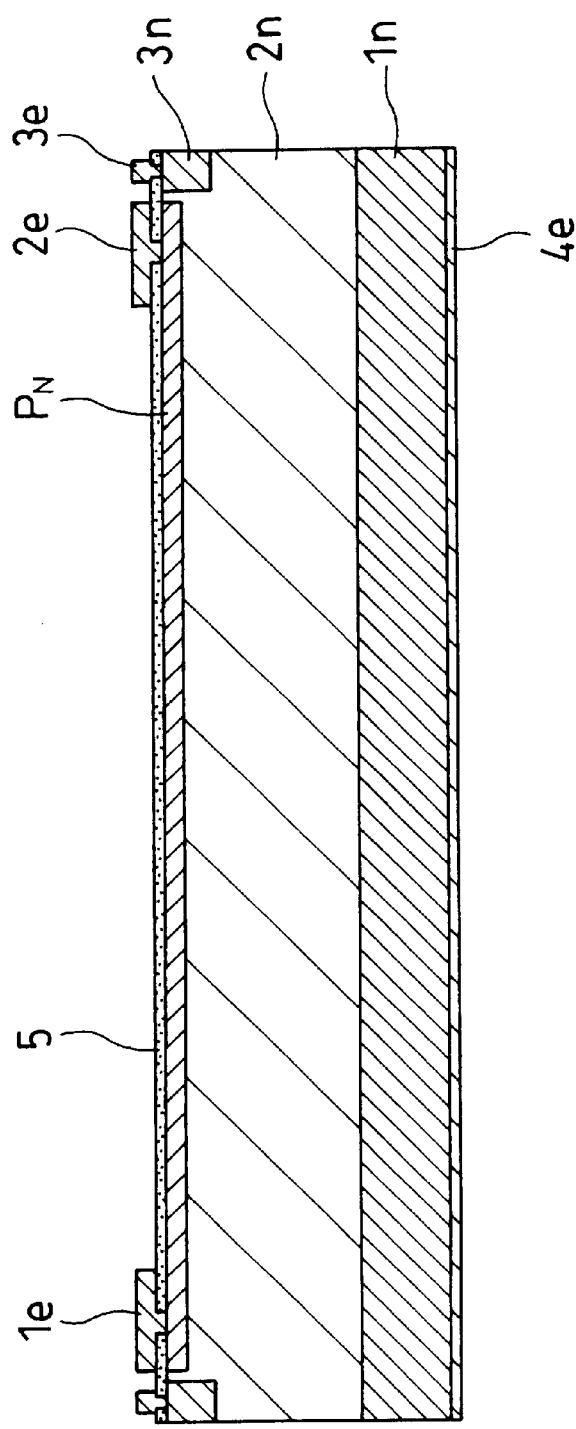
FIG. 30 is a sectional view taken along an arrow II—II of the PSD in FIG. 28.

FIG. 28 is a top view of a PSD according to the ninth embodiment. FIG. 29 is a sectional view taken along an arrow I—I of the PSD in FIG. 28. FIG. 30 is a sectional view taken along an arrow II—II of the PSD in FIG. 28. The PSD of this embodiment is obtained by substantially equalizing the impurity concentrations of the resistive region $P_N$, conductive strips $4P_N$, and signal extraction semiconductor layers 1p and 2p in the first embodiment. According to this PSD, resistive region $P_N$, conductive strips $4P_N$, and signal extraction semiconductor layers 1p and 2p are simultaneously formed by doping a semiconductor substrate 2n with a p-type impurity. If the impurity concentration of the signal extraction semiconductor layers 1p and 2p is increased to allow ohmic contact with signal extraction electrodes 1e and 2e, the resistivity of the resistive region $P_N$ as a resistive layer decreases. The resistivity is therefore increased by decreasing a depth Z of the resistive region $P_N$ thus obtaining a desired resistance value. According to the PSD of this embodiment, the impurity concentration of the resistive region $P_N$, conductive strips $4P_N$, and signal extraction semiconductor layers 1p and 2p is high, and their depths Z in the thickness direction of the surface are the same. However, since the depth Z is small, the signal extraction semiconductor layers 1p and 2p are in ohmic-contact with the electrodes 1e and 2e, and the resistive region $P_N$ has a resistance value enough to detect position. In addition, since n-type branch regions $4n_2$ to $4n_{19}$ are shallower than p-type conductive strips $4P_1$ to $4P_{20}$, the branch regions $4n_2$ to $4n_{19}$ are interposed between the conductive strips $4P_1$ to $4P_{20}$ to further electrically isolate the conductive strips $4P_1$ to $4P_{20}$. The branch regions $4n_1$ to $4n_{20}$ are respectively interposed between conductive strips $4P_1$ and $4P_{20}$ and signal extraction semiconductor layers 1p and 2p which are located on the outermost sides along the lengthwise direction X to electrically isolate the conductive strips $4P_1$ and $4P_{20}$ from the signal extraction semiconductor layers 1p and 2p, respectively. According to the PSD of this embodiment, since the resistive region $P_N$, conductive strips $4P_N$, and signal extraction semiconductor layers 1p and 2p are formed in the same step, the PSD can be easily manufactured as compared with the PSD of each embodiment described above.

(10th Embodiment)

Figure 31:
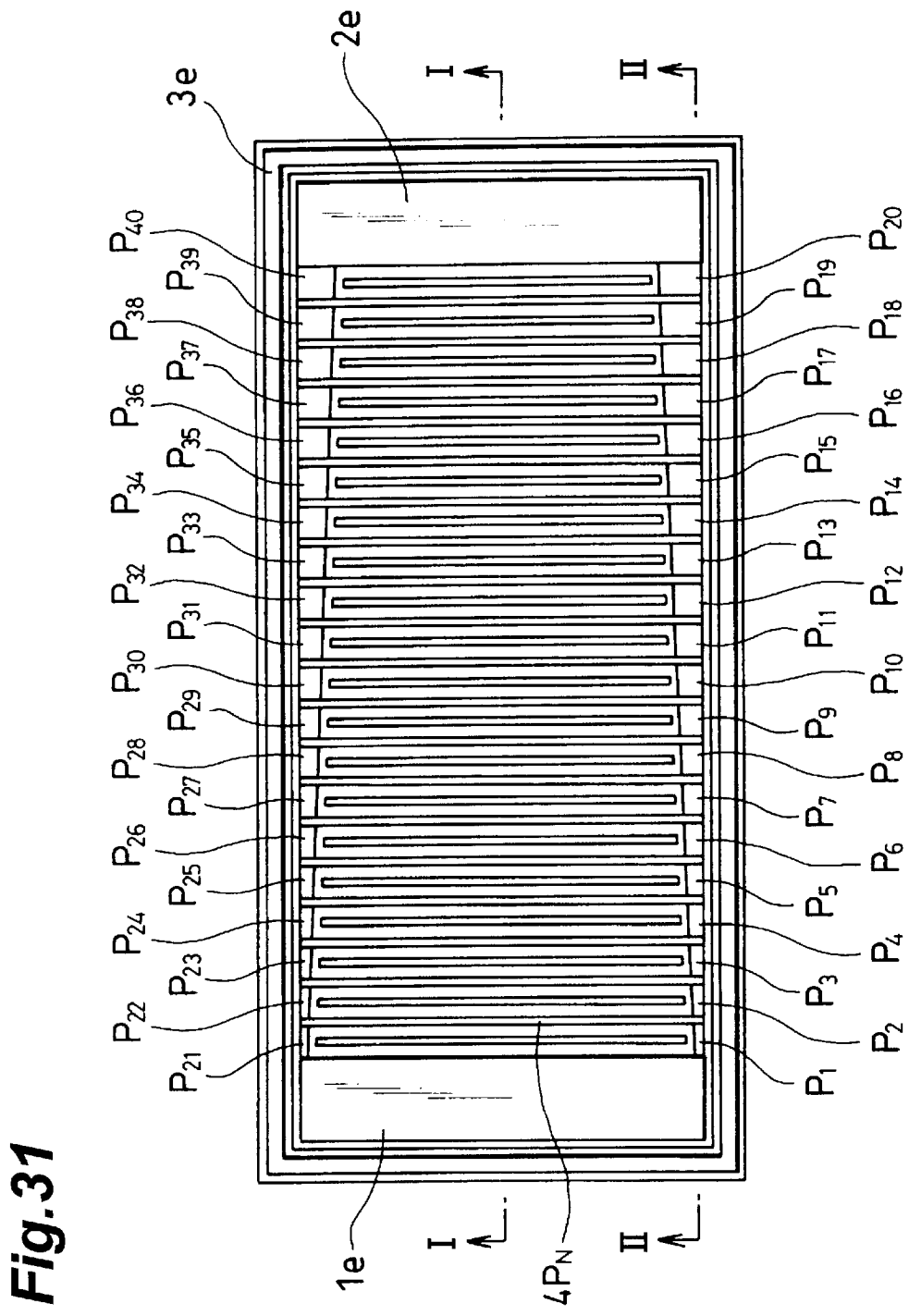
FIG. 31 is a top view of a PSD according to the 10th embodiment.
Figure 32:
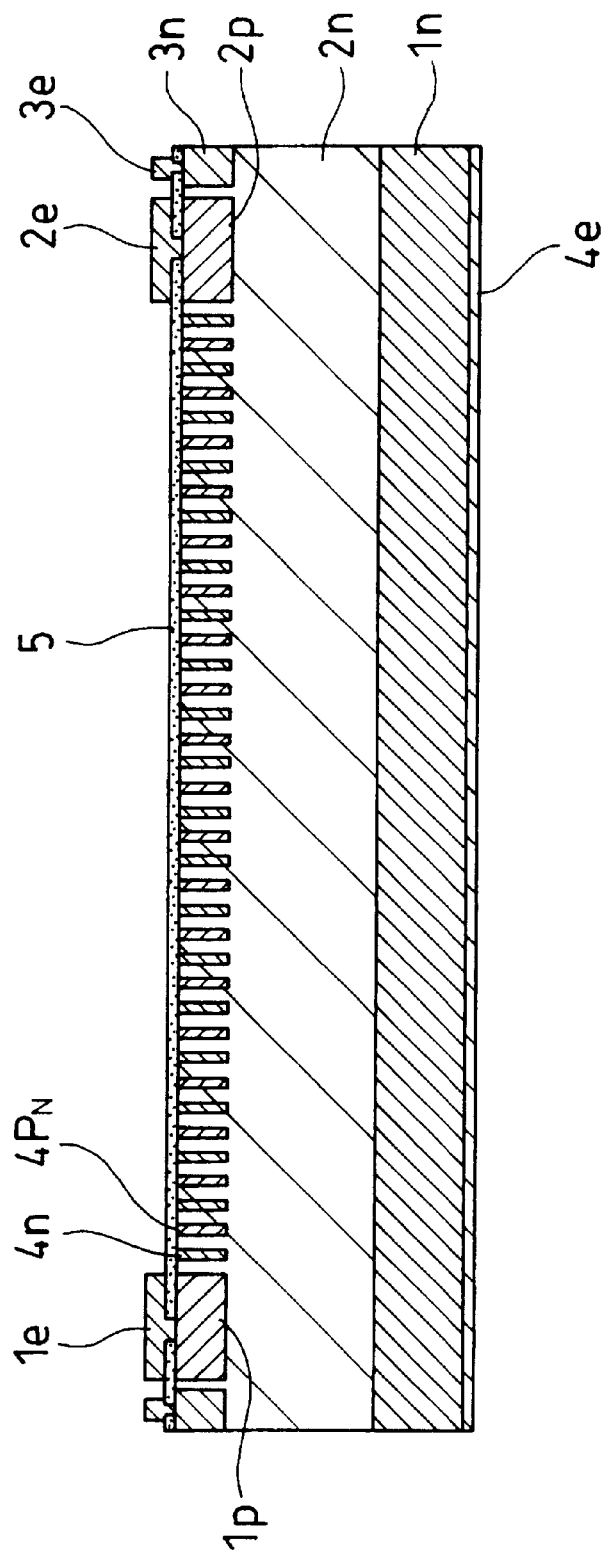
FIG. 32 is a sectional view taken along an arrow I—I of the PSD in FIG. 31.
Figure 33:
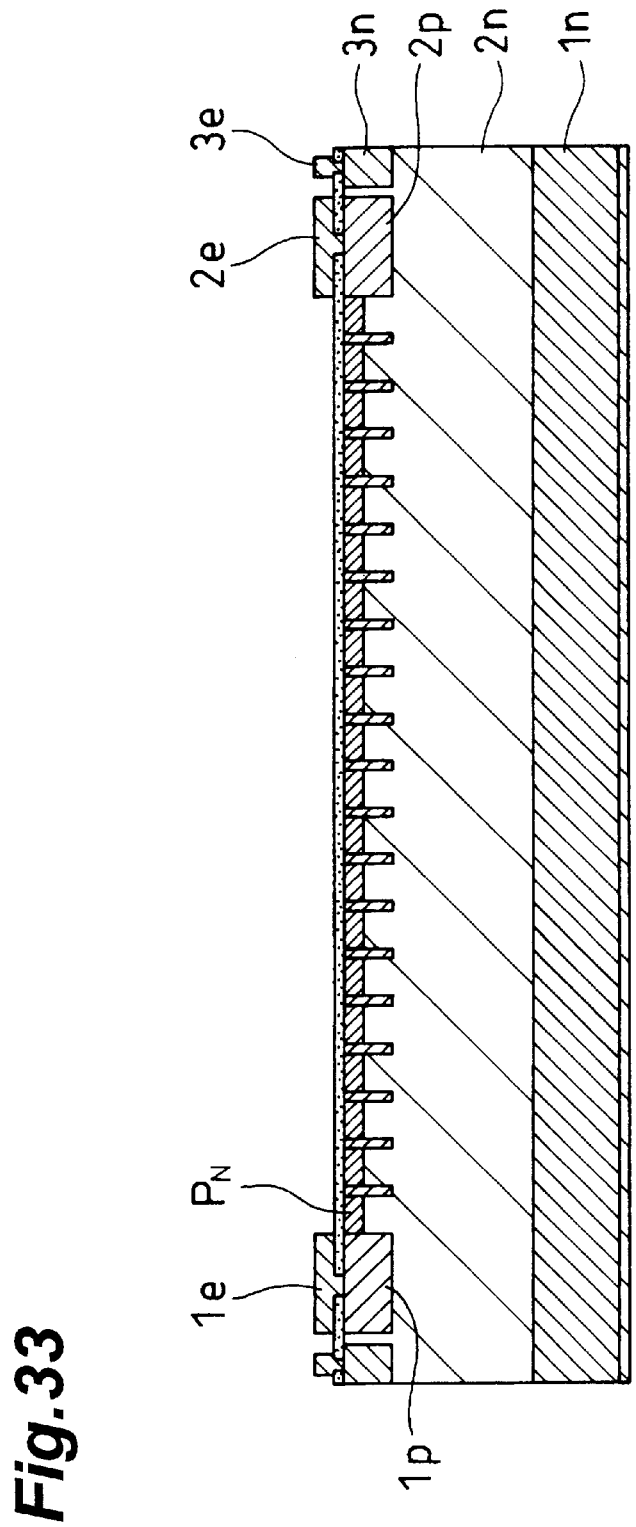
FIG. 33 is a sectional view taken along an arrow II—II of the PSD in FIG. 31.

FIG. 31 is a top view of a PSD according to the 10th embodiment. FIG. 32 is a sectional view taken along an arrow I—I of the PSD in FIG. 31. FIG. 33 is a sectional view taken along an arrow II—II of the PSD in FIG. 31. The PSD of this embodiment is obtained by reducing a width Y of resistive regions $P_1$ to $P_{20}$ constituting a resistive region $P_N$ to ½ that of the resistive regions $P_1$ to $P_{20}$ of the PSD of the first embodiment, forming resistive regions $P_{21}$ to $P_{40}$ symmetrical with the resistive regions $P_1$ to $P_{20}$ about the central line of the PSD in a widthwise direction Y which runs along a lengthwise direction X, connecting the symmetrical resistive regions to each other through conductive strips $4P_N$, and connecting signal extraction electrodes 1e and 2e in parallel with each other through the resistive regions $P_1$ to $P_{20}$ and $P_{21}$ to $P_{40}$.

(11th Embodiment)

Figure 34:
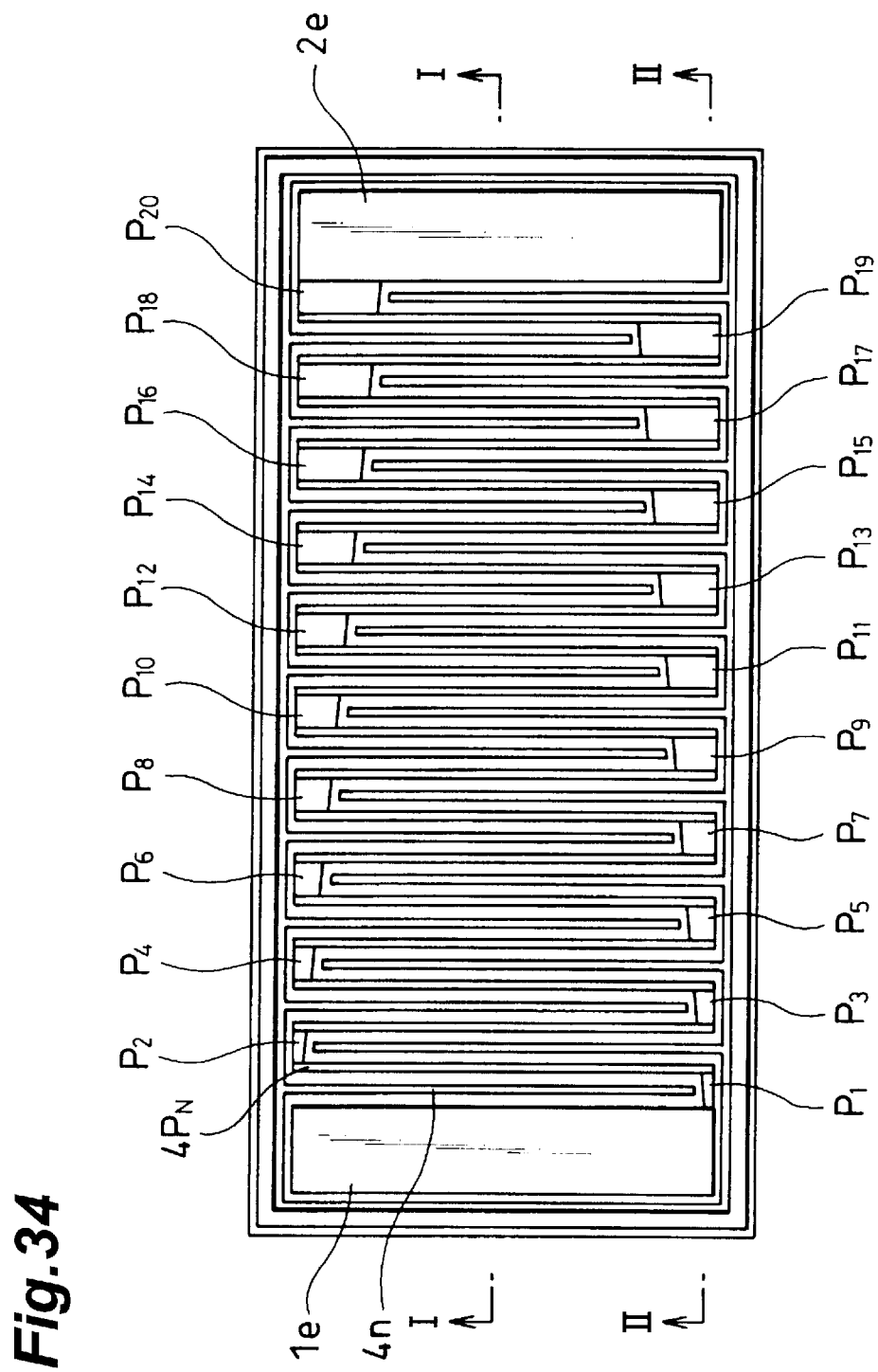
FIG. 34 is a top view of a PSD according to the 11th embodiment.
Figure 35:
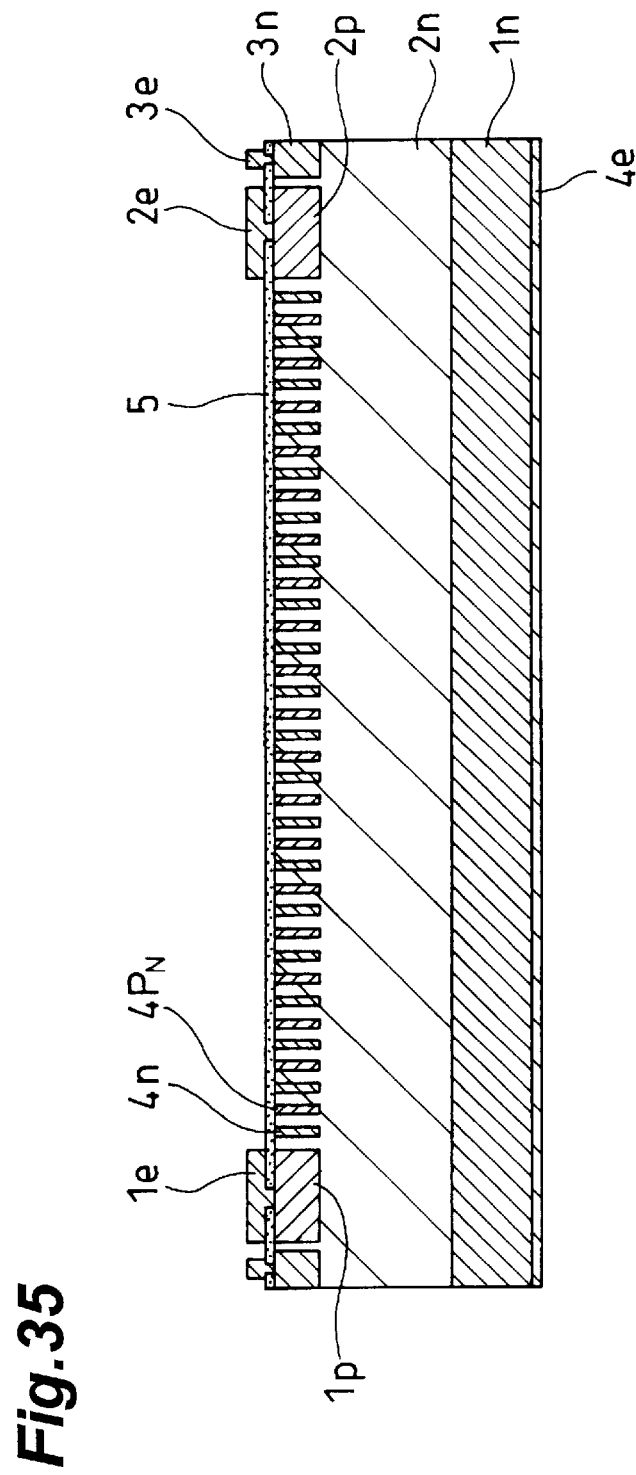
FIG. 35 is a sectional view taken along an arrow I—I of the PSD in FIG. 34.
Figure 36:
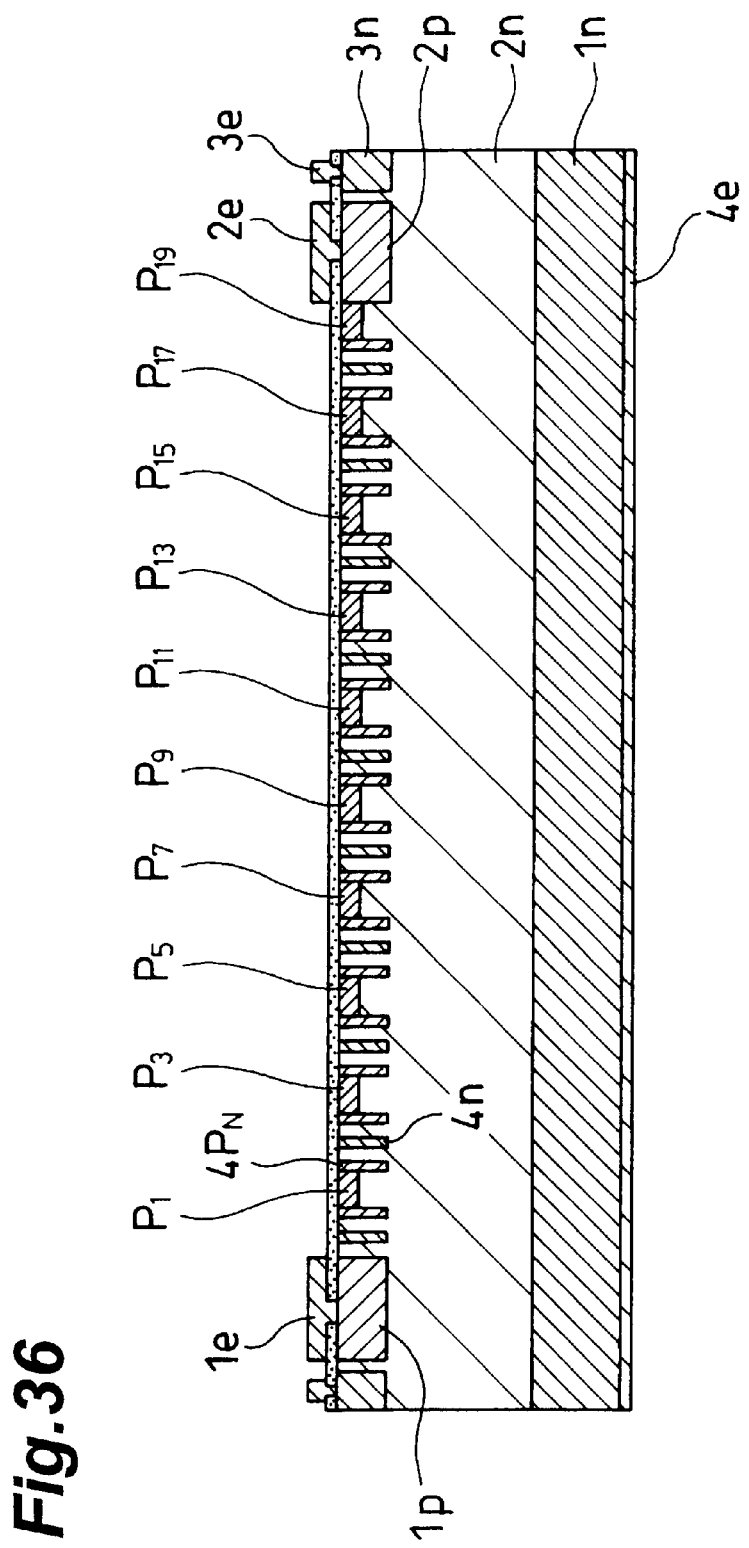
FIG. 36 is a sectional view taken along an arrow II—II of the PSD in FIG. 34.

FIG. 34 is a top view of a PSD according to the 11th embodiment. FIG. 35 is a sectional view taken along an arrow I—I of the PSD in FIG. 34. FIG. 36 is a sectional view taken along an arrow II—II of the PSD in FIG. 34. The PSD of this embodiment is obtained by symmetrically moving even-numbered resistive regions $P_{2n}$ (n is an integer from 1 to 10), of the resistive regions $P_1$ to $P_{20}$ constituting the resistive region $P_N$ of the PSD of the first embodiment, about the central line of the PSD in the widthwise direction Y which runs along the lengthwise direction X, connecting odd-numbered resistive regions $P_{2n}$ and $P_{2n+1}$ (2n+1<21) adjacent to the odd-numbered resistive region $P_{2n}$ to each other through a conductive strips $4P_N$, and connecting signal extraction electrodes 1e and 2e in series with each other through the resistive regions $P_1$ to $P_{20}$.

(12th Embodiment)

Figure 37:
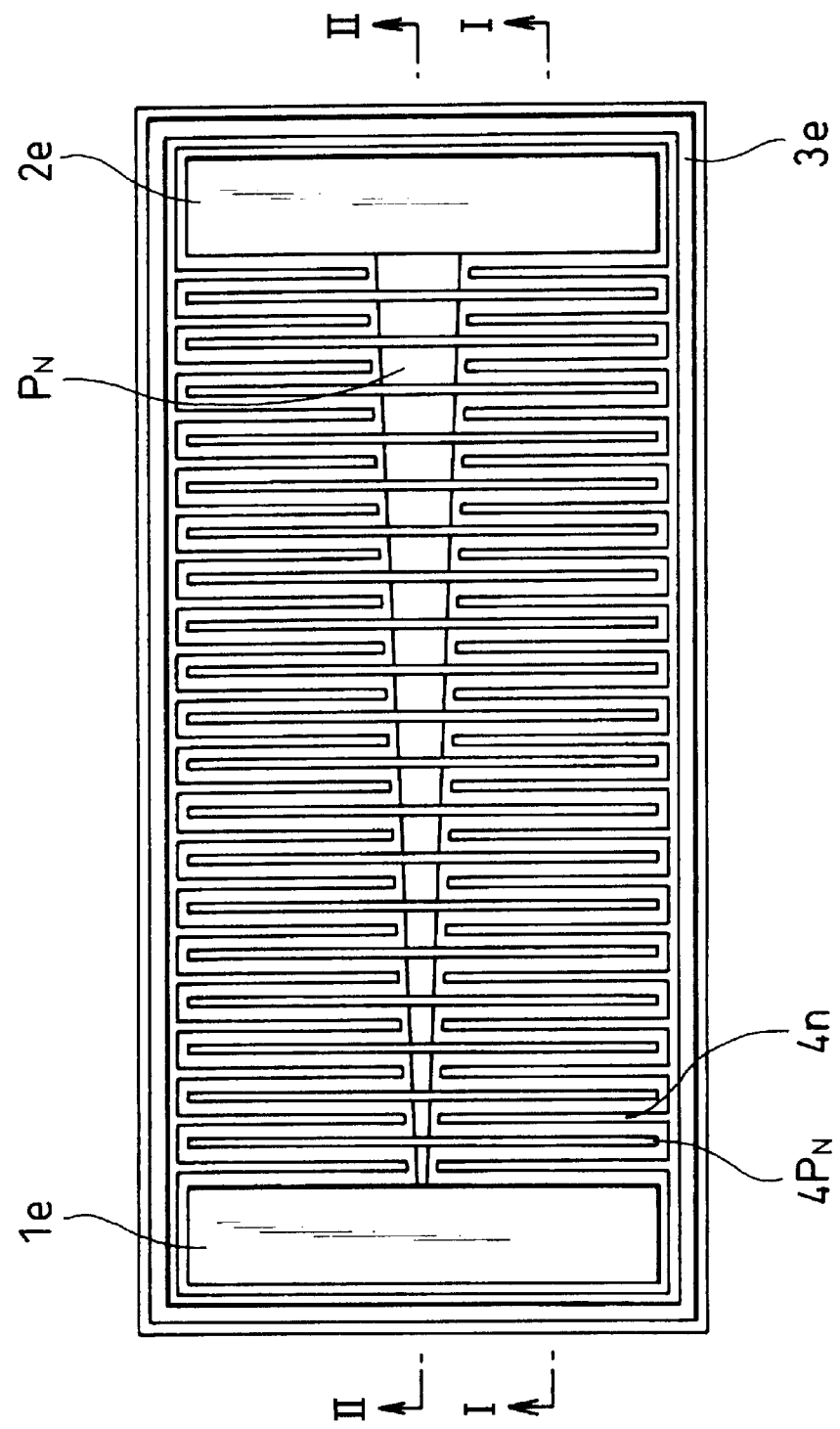
FIG. 37 is a top view of a PSD according to the 12th embodiment.

FIG. 37 is a top view of a PSD according to the 12th embodiment. FIG. 38 is a sectional view taken along an arrow I—I of the PSD in FIG. 37. FIG. 39 is a sectional view taken along an arrow II—II of the PSD in FIG. 37. The PSD of this embodiment is obtained by making the central line of the resistive regions $P_1$ to $P_{20}$ constituting the resistive region $P_N$ of the PSD of the first embodiment in the widthwise direction Y coincide with the central line of the rectangular surface of the PSD in the widthwise direction Y which runs along the lengthwise direction X.

As has been described above, in each semiconductor position sensitive detector according to the present invention, since charges generated by light and collected in the conductive strips are extracted from the two ends of the resistive region having a variable width, an output current corresponding to the distance from the semiconductor position sensitive detector can be extracted with high precision regardless of the shape of incident light, e.g., a spot shape or slit shape.

INDUSTRIAL APPLICABILITY

A semiconductor position sensitive detector (PSD) of the present invention is a device for measuring the distance to an object by using the so-called triangulation principle or the like, and can be mounted as an active distance measuring device in an image sensor such as a camera.

What is claimed is:

1. A semiconductor position sensitive detector comprising:
   a main resistive region including a plurality of resistive regions continuously lined up in a predetermined direction; and
   a plurality of conductive strips running from said main resistive region along a surface of said position sensitive detector such that different output currents are obtained from two ends of said resistive region in accordance with incident light positions on the surface,
   wherein said resistive regions have substantially the same resistivity, and gradually increase in width in a direction perpendicular to the predetermined direction from one end to the other end of said main resistive region.

2. A detector according to claim 1, characterized in that the width of each of said resistive regions is a linear or quadratic function of position from one end of said main resistive region along the predetermined direction.

3. A detector according to claim 1, characterized by further comprising a semiconductor region which is adjacent to a predetermined one of said conductive strips, which runs from a resistive region located on one end portion of said main resistive region and having a smallest width, and has a resistivity lower than that of said resistive region, and a signal extraction electrode which is formed at a position into which a charge passing through said semiconductor region can flow without the mediacy of said main resistive region in accordance with the incident light, and from which one of the output currents is extracted.

4. A detector according to claim 2, characterized by further comprising a light-shielding film formed on said main resistive region.

5. A detector according to claim 4, characterized in that said detector further comprises a pair of signal extraction electrodes from which output currents from the two ends of said main resistive region are respectively extracted, said main resistive region is positioned between said signal extraction electrodes, and said light-shielding film is made of an insulating material and covers said main resistive region between said signal extraction electrodes.

6. A detector according to claim 5, characterized in that said light-shielding film is made of a black photoresist.

* * * * *